United States Patent
Liu et al.

(10) Patent No.: US 12,351,916 B2
(45) Date of Patent: Jul. 8, 2025

(54) GAS SHOWERHEAD WITH CONTROLLABLE AIRFLOW DISTRIBUTION

(71) Applicant: Piotech Inc., Shenyang (CN)

(72) Inventors: Zhenjie Liu, Shenyang (CN); Xue Liu, Shenyang (CN); Zhi Chai, Shenyang (CN); Guangjie Qi, Shenyang (CN)

(73) Assignee: Piotech Inc., Shenyang (CN)

( * ) Notice: Subject to any disclaimer, the term of this patent is extended or adjusted under 35 U.S.C. 154(b) by 630 days.

(21) Appl. No.: 17/564,387

(22) Filed: Dec. 29, 2021

(65) Prior Publication Data

US 2022/0205101 A1 Jun. 30, 2022

(30) Foreign Application Priority Data

Dec. 31, 2020 (CN) .......................... 202011643092.7

(51) Int. Cl.
*C23C 16/455* (2006.01)
*C23C 16/458* (2006.01)
(Continued)

(52) U.S. Cl.
CPC .. *C23C 16/45565* (2013.01); *C23C 16/45589* (2013.01); *C23C 16/4584* (2013.01); *C23C 16/52* (2013.01); *H01J 37/32449* (2013.01)

(58) Field of Classification Search
CPC ........ C23C 16/45565; C23C 16/45587; C23C 16/45589; C23C 16/45591;
(Continued)

(56) References Cited

U.S. PATENT DOCUMENTS 4,134,425 A * 1/1979 Gussefeld .............. B01J 8/0278
  137/625.3
6,245,192 B1 * 6/2001 Dhindsa ............ C23C 16/45572
  438/731
(Continued)

FOREIGN PATENT DOCUMENTS

| CN | 1397991 A | 2/2003 |
| CN | 102648512 B | 4/2015 |
| CN | 206432235 U | 8/2017 |

OTHER PUBLICATIONS

First Office Action issued on Jan. 9, 2023 in counterpart Taiwan Patent Application No. 110149671.

*Primary Examiner* — Kurt Sweely
(74) *Attorney, Agent, or Firm* — Blank Rome LLP

(57) ABSTRACT

Provided is a gas showerhead with controllable airflow distribution, disposed in a cavity of a thin film deposition device and including: a first-layer panel, having a plurality of first gas supply holes distributed according to a first rule; and a second-layer panel, seated on the first-layer panel and having a plurality of second gas supply holes distributed according to a second rule. The first rule is different from the second rule, and one of the first-layer panel and the second-layer panel is capable of rotating at least by a specific angle relative to the other, so that the two panels have a first position and a second position that are different relative to each other. At the first position, none of the first gas supply holes is covered by the second-layer panel; and at the second position, a portion of the first gas supply holes are aligned with the corresponding second gas supply holes, and the other portion of the first gas supply holes are covered by the second-layer panel. The gas showerhead can adjust the airflow distribution and the airflow rate, which helps to meet the spraying requirements of different thin film deposition processes, and improves the uniformity of a deposited thin film.

20 Claims, 24 Drawing Sheets

(51) Int. Cl.
*C23C 16/52* (2006.01)
*H01J 37/32* (2006.01)

(58) Field of Classification Search
CPC ........ H01J 37/323244; H01J 37/32449; B05B 1/0005; B05B 1/1654
See application file for complete search history.

(56) References Cited

U.S. PATENT DOCUMENTS

| | | | |
|---|---|---|---|
| 6,820,570 B2* | 11/2004 | Kilpela | C23C 16/509 |
| | | | 156/345.43 |
| 6,872,258 B2* | 3/2005 | Park | C23C 16/45589 |
| | | | 156/345.33 |
| 2006/0162662 A1* | 7/2006 | Sato | C23C 14/543 |
| | | | 427/255.6 |
| 2012/0027918 A1* | 2/2012 | Tiner | C23C 16/45565 |
| | | | 118/715 |
| 2012/0222616 A1 | 9/2012 | Han et al. | |
| 2015/0167705 A1* | 6/2015 | Lee | H01J 37/3244 |
| | | | 138/40 |
| 2017/0081763 A1* | 3/2017 | Tiner | C23C 16/45565 |
| 2017/0207077 A1* | 7/2017 | Nagorny | H01J 37/32009 |
| 2019/0262845 A1* | 8/2019 | Bruce | B05B 1/3006 |
| 2020/0051791 A1* | 2/2020 | Lin | H01J 37/32715 |

\* cited by examiner

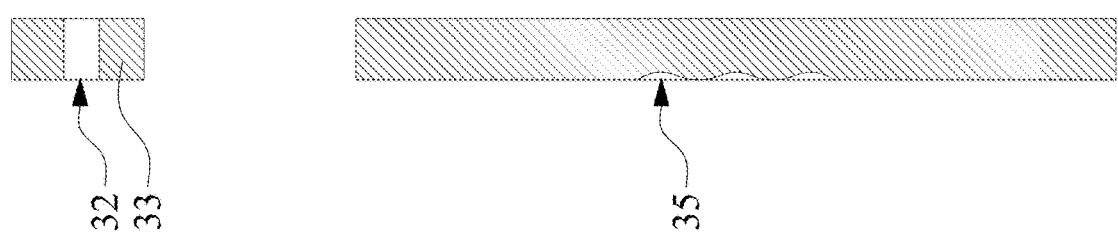

GAS SHOWERHEAD WITH CONTROLLABLE AIRFLOW DISTRIBUTION

RELATED APPLICATION

This application claims priority to Chinese Patent Application No. 202011643092.7 filed on Dec. 31, 2020, and all the benefits accruing therefrom under 35 U.S.C. § 119, the contents of which in its entirety are herein incorporated by reference.

BACKGROUND OF THE INVENTION

1. Field of the Invention

This application generally relates to the field of semiconductor wafer and substrate processing, and in particular, to a gas showerhead for spraying gas onto a wafer or substrate in a semiconductor processing cavity.

2. Description of the Related Art

A wafer or a substrate is a base for preparing a semiconductor device. To prepare a semiconductor device (for example, an integrated circuit or a semiconductor light-emitting device), a wafer or substrate needs to be placed in a semiconductor processing cavity and heated for deposition (for example, chemical vapor deposition (CVD) or plasma-enhanced chemical vapor deposition (PECVD)), to deposit a thin film on the surface of the wafer or the substrate. To deposit a thin film on the surface of the wafer, a gas showerhead in the semiconductor processing cavity needs to be used to spray a source gas and a reaction gas onto the surface of the wafer.

In the thin film deposition device in the prior art, the quantity and distribution of through holes of the gas showerhead used to spray the source gas and the reaction gas are fixed and cannot be adjusted. Such a gas showerhead has the following disadvantages. On the one hand, different spraying requirements (for example, different spraying speeds and spraying flow rates) in different thin film deposition processes cannot be met. With the development of semiconductor devices, more diversified thin film deposition processes are required, and various spraying requirements arise. Such a showerhead in the prior art has a limited range of application, which also limits the range of application of the thin film deposition device. On the other hand, the distribution of the through holes on such a gas showerhead cannot be adjusted, which is not conducive to improving the uniformity of the deposited thin film. In particular, newly developed thin film processes require increasingly higher film uniformity, and the simulation and experimental processes for developing a large quantity of novel processes require considerable costs. The structures of the showerheads in the prior art have limitations in the development of novel thin film deposition processes.

Therefore, it is necessary to improve the showerheads in the prior art to resolve the foregoing technical problems.

SUMMARY OF THE INVENTION

The purpose of this application is to resolve at least one of the foregoing problems in the prior art, and to provide a gas showerhead with controllable airflow distribution. The gas showerhead can adjust the airflow distribution and the airflow rate, which not only helps to meet the spraying requirements of different thin film deposition processes, but also helps to improve the uniformity of a deposited thin film. Therefore, the gas showerhead is suitable for the development of novel film deposition processes, and reduces the costs of the novel film deposition processes.

The gas showerhead with controllable airflow distribution provided according to an embodiment of this application is disposed in a cavity of a thin film deposition device and includes: a first-layer panel, having a plurality of first gas supply holes distributed according to a first rule; and a second-layer panel, seated on the first-layer panel and having a plurality of second gas supply holes distributed according to a second rule. The first rule is different from the second rule, and one of the first-layer panel and the second-layer panel is capable of rotating at least by a specific angle relative to the other, so that the two panels have a first position and a second position that are different relative to each other. At the first position, none of the first gas supply holes is covered by the second-layer panel; and at the second position, a portion of the first gas supply holes are aligned with the corresponding second gas supply holes, and the other portion of the first gas supply holes are covered by the second-layer panel.

Preferably, in the foregoing embodiment, the first-layer panel is stationary, and the second-layer panel is capable of being driven by a first rotating device to rotate at least by a specific angle. For example, the second-layer panel is capable of rotating by 3°-10° relative to the first-layer panel.

In an implementation of the foregoing embodiment, the first rotating device is adjacent to an edge of the second-layer panel, and includes a rotating column capable of being driven to rotate and a control column fixedly connected to or integrally formed with the rotating column; and an elongated slot matching the control column is formed on the second-layer panel, so that when the rotating column is driven to rotate, the control column matching the elongated slot drives the second-layer panel to rotate.

Preferably, the second-layer panel includes a lug extending outward from its edge, and the elongated slot is formed in the lug.

Preferably, the first-layer panel further includes an annular peripheral wall extending upward from an edge of the first-layer panel, a first notch facing inward is formed on an inner side of the annular peripheral wall, and the rotating column, the control column and the lug are all located in the first notch.

Preferably, the width of the first notch is greater than the width of the lug, so that the second-layer panel is capable of rotating by 3°-5° relative to the first-layer panel.

In an implementation of the foregoing embodiment, the first rotating device is adjacent to an edge of the second-layer panel, and includes a gear; and the edge of the second-layer panel includes a plurality of teeth meshing with the gear, so that when the gear is driven to rotate, the teeth drive the second-layer panel to rotate.

Preferably, a plurality of wavy concave and convex portions are formed on an upper surface of the first-layer panel, and a rolling wheel capable of rolling on the concave and convex portions is correspondingly disposed on the second-layer panel, so that when the first-layer panel and the second-layer panel rotate relative to each other, the rolling wheel rolls on the concave and convex portions.

Preferably, when the first-layer panel and the second-layer panel are located at the first position and the second position relative to each other, the rolling wheel is located on two different wave troughs of the concave and convex portions, and a lower surface of the second-layer panel is in close contact with the upper surface of the first-layer panel.

In a preferable implementation, the foregoing gas showerhead further includes a third-layer panel seated on the second-layer panel, the third-layer panel having a plurality of third gas supply holes distributed according to a third rule, the third rule being different from the first rule and the second rule.

Preferably, the third-layer panel is capable of being driven by a second rotating device to rotate at least by a specific angle. For example, the third-layer panel is capable of rotating by 3°-10° relative to the first-layer panel.

In an embodiment, the second rotating device is adjacent to an edge of the third-layer panel, and includes a rotating column capable of being driven to rotate and a control column fixedly connected to or integrally formed with the rotating column; and an elongated slot matching the control column is formed on the third-layer panel, so that when the rotating column is driven to rotate, the control column matching the elongated slot drives the third-layer panel to rotate.

In the foregoing embodiment, the third-layer panel includes a lug extending outward from the edge, and the elongated slot is formed in the lug.

Preferably, the first-layer panel further includes an annular peripheral wall extending upward from an edge of the first-layer panel, a second notch facing inward is formed on an inner side of the annular peripheral wall, and the rotating column, the control column and the lug are all located in the second notch.

Preferably, the width of the second notch is greater than the width of the lug, so that the third-layer panel is capable of rotating by 3°-5° relative to the first-layer panel.

In another embodiment, the second rotating device is adjacent to an edge of the third-layer panel, and includes a gear; and the edge of the third-layer panel includes a plurality of teeth meshing with the gear, so that when the gear is driven to rotate, the teeth drive the third-layer panel to rotate.

Preferably, a plurality of wavy concave and convex portions are formed on a lower surface of the third-layer panel, and a rolling wheel capable of rolling on the concave and convex portions is correspondingly disposed on the second-layer panel, so that when the third-layer panel rotates relative to the second-layer panel, the rolling wheel rolls on the concave and convex portions.

In the foregoing embodiment, the concave and convex portions have at least two different wave troughs, and when the rolling wheel is located in the wave troughs of the concave and convex portions, the lower surface of the third-layer panel is in close contact with an upper surface of the second-layer panel.

Preferably, the first-layer panel, the second-layer panel, and the third-layer panel are all substantially disc-shaped, and are disposed concentrically.

Preferably, the first-layer panel further includes an annular peripheral wall extending upward from an edge of the first-layer panel, so that a concave cavity is formed in the middle of the first-layer panel, both the second-layer panel and the third-layer panel being located in the concave cavity.

Preferably, a plurality of rolling columns are disposed on an inner side of the annular peripheral wall, the plurality of rolling columns protruding from an inner surface of the annular peripheral wall and being in close contact with the edges of the second-layer panel and the third-layer panel to provide positioning therefor.

The gas showerhead with controllable airflow distribution according to this application can produce the following superior technical effects:

Since the gas showerhead includes two or more layers of panels that can be rotated relative to each other, and the through holes on each layer of panel are distributed according to different rules, each layer of panel may be rotated to different positions relative to each other, so that the holes on each layer of panel form different combinations (for example, at a position, all the holes on the bottom layer of panel (that is, the panel close to the wafer) are in a through state (that is, not blocked); while at another position, a portion of the holes on the bottom layer of panel are blocked, and only the other holes are in the through state).

Therefore, when the panels are located at different positions relative to each other, different through holes are in the through state. In this way, the gas showerhead can adjust the airflow distribution and the airflow rate, which not only helps to meet the spraying requirements of different thin film deposition processes, but also helps to improve the uniformity of a deposited thin film. Therefore, the gas showerhead is suitable for the development of novel film deposition processes, and reduces the costs of developing the novel film deposition processes.

BRIEF DESCRIPTION OF THE DRAWINGS

To more clearly illustrate the specific implementation of this application and the technical effects produced, the specific embodiments of this application are described below with reference to the accompanying drawings. To express clearly and facilitate arrangement of the drawings, the accompanying drawings are not completely drawn to scale. For example, some of the drawings are enlarged to show partial details, and some of the drawings are shrunk to show an overall structure. In the drawings:

FIG. 4D is an enlarged cross-sectional view along D-D of FIG. 4B, which particularly shows concave and convex portions of the third-layer panel;

PREFERRED EMBODIMENT OF THE PRESENT INVENTION

Embodiments of this application are described in detail below with reference to the accompanying drawings. Various aspects of this application are easier to be understood by reading the following descriptions of the specific embodiments with reference to the accompanying drawings. It should be noted that, these embodiments are merely examples and used to explain and illustrate the technical solutions of this application, and are not intended to limit this application. A person skilled in the art may make various modifications and variations (for example, more than three layers of panels) based on these embodiments, and all technical solutions obtained by equivalent transformations shall fall within the protection scope of this application. The names of various components are used in this specification for illustration purposes only, and cannot be interpreted as limiting this application. Different manufacturers may use different names to refer to components having the same function.

Figure 1:
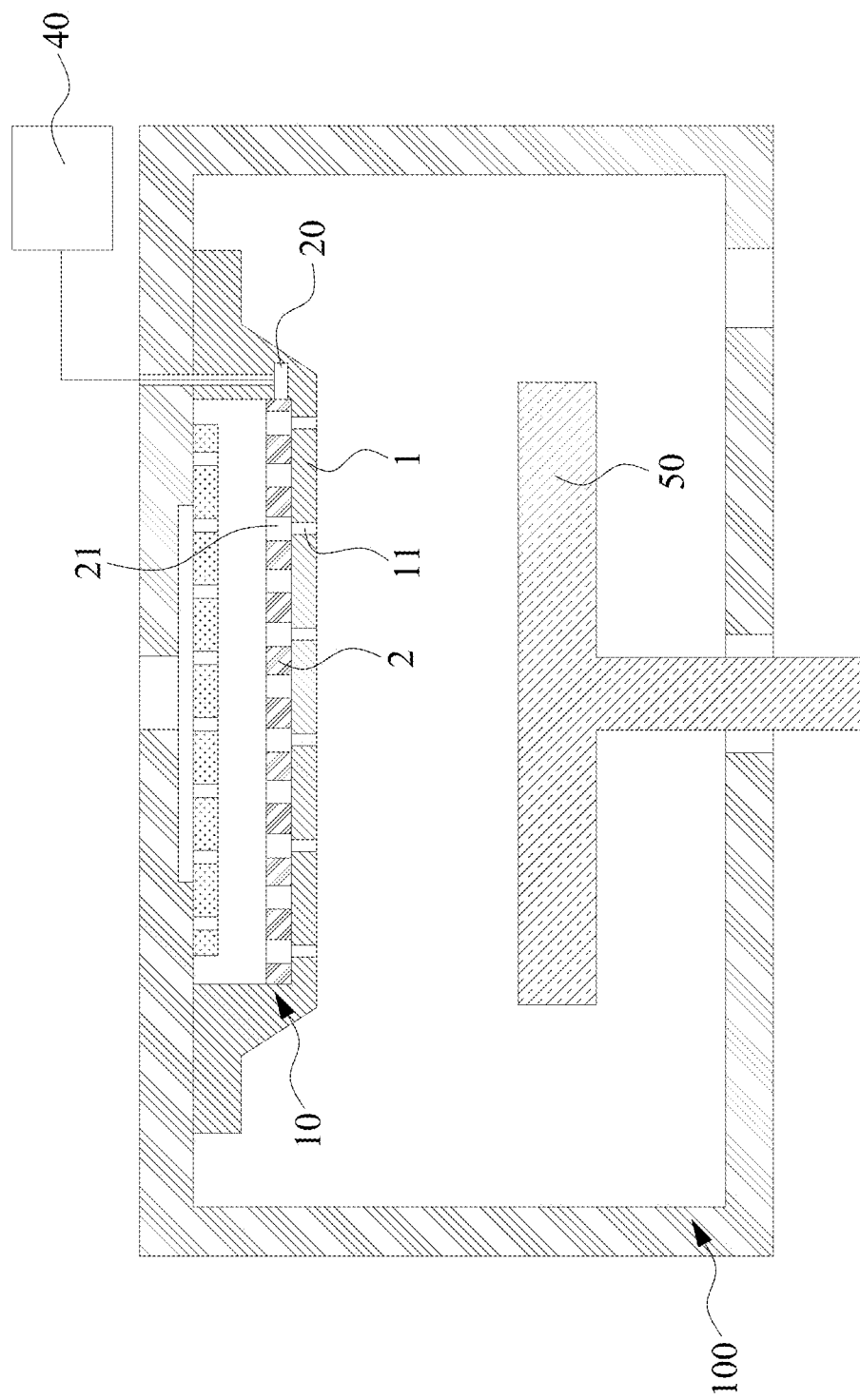
FIG. 1 is a schematic cross-sectional view of a substrate processing cavity using a gas showerhead according to an embodiment of this application.

FIG. 1 is a schematic cross-sectional view of a substrate processing cavity using a gas showerhead according to an embodiment of this application. Referring to FIG. 1, the gas showerhead 10 with controllable airflow distribution provided according to this application is disposed in a cavity 100 (that is, the substrate processing cavity) of a thin film deposition device, and is configured to spraying gas onto a wafer or substrate placed on a wafer or substrate carrier 50 for thin film deposition.

Different from the prior art, the gas showerhead 10 of this application includes a plurality of layers of panels, such as a first-layer panel 1 and a second-layer panel 2 seated on the first-layer panel 1 in FIG. 1, and through holes on each layer of panel follow different rules (that is, have a different layout and/or quantity). For example, the first-layer panel 1 has a plurality of first gas supply holes 11 distributed according to a first rule; and the second-layer panel 2 has a plurality of second gas supply holes 21 distributed according to a second rule, the first rule being different from the second rule. The different rules are required, which is because if the distribution rules of the gas supply holes 11 and 21 on the first-layer panel 1 and the second-layer panel 2 are the same (that is, the layouts and the quantities are the same), all the gas supply holes 11 on the first-layer panel 1 (that is, the panel close to the wafer being sprayed) are either completely covered or completely penetrated. In this case, no adjustment can be made.

Further, in this application, one of the first-layer panel 1 and the second-layer panel 2 is capable of rotating at least by a specific angle relative to the other, so that the two panels have a first position and a second position that are different relative to each other. At the first position (for example, an original position), none of the first gas supply holes 11 is covered by the second-layer panel 2 (similar to the positions shown in FIG. 5A to FIG. 5D, where details are described below). In this case, all the first gas supply holes 11 can be used to spray gas, so that the gas can be sprayed according to the maximum spraying volume. At the second position (for example, a position after rotation), a portion of the first gas supply holes 11 are aligned with the corresponding second gas supply holes 21, and the other portion of the first gas supply holes 11 are covered by the second-layer panel 2 (similar to the positions shown in FIG. 6A to FIG. 6C, where details are described below). In this case, only the uncovered gas supply holes 11 can be used to spray the gas. Apparently, the amount of spraying is less than that at the first position, and only the positions corresponding to these gas supply holes 11 are sprayed with the gas. Therefore, the spraying volume and the airflow distribution can be adjusted. In some embodiments, the through holes on adjacent panels may have different rules (that is, have different layouts and/or quantities), the through holes on non-adjacent panels may have the same rule (that is, have the same layout and/or quantity), and by relative rotation of each layer of panel, the spraying volume and the airflow distribution can be adjusted.

As can be seen, the technical solutions produced by the new inventive concept of this application can bring about the following beneficial technical effects: the hole distribution of the gas showerhead can be changed to control the airflow distribution, which resolves the problem of high costs in novel process development, and optimizes the film uniformity of the same process through the airflow compensation function. Apparently, such a gas showerhead that can automatically adjust the airflow distribution provides flexibility in process adjustment, improves the film uniformity, and reduces process development costs.

A gas showerhead provided according to a preferred embodiment of this application includes three layers of panels: a first-layer panel 1, a second-layer panel 2, and a third-layer panel 3 (as shown in FIG. 5A to FIG. 5C and FIG. 6A to FIG. 6C). The second-layer panel 2 is seated on the first-layer panel 1, and the third-layer panel 3 is seated on the second-layer panel 2. The first-layer panel 1 is stationary, and the second-layer panel 2 and the third-layer panel 3 are capable of being driven respectively by a rotating device to rotate. For example, both the second-layer panel 2 and the third-layer panel 3 can rotate by 3°-10°, 3°-8°, or 3°-5° relative to the first-layer panel 1. The specific degree of rotation may be determined by a person skilled in the art according to various factors such as the quantity of panels, the distribution of gas supply holes on the panels, and the requirements of gas spraying.

Figure 2A:
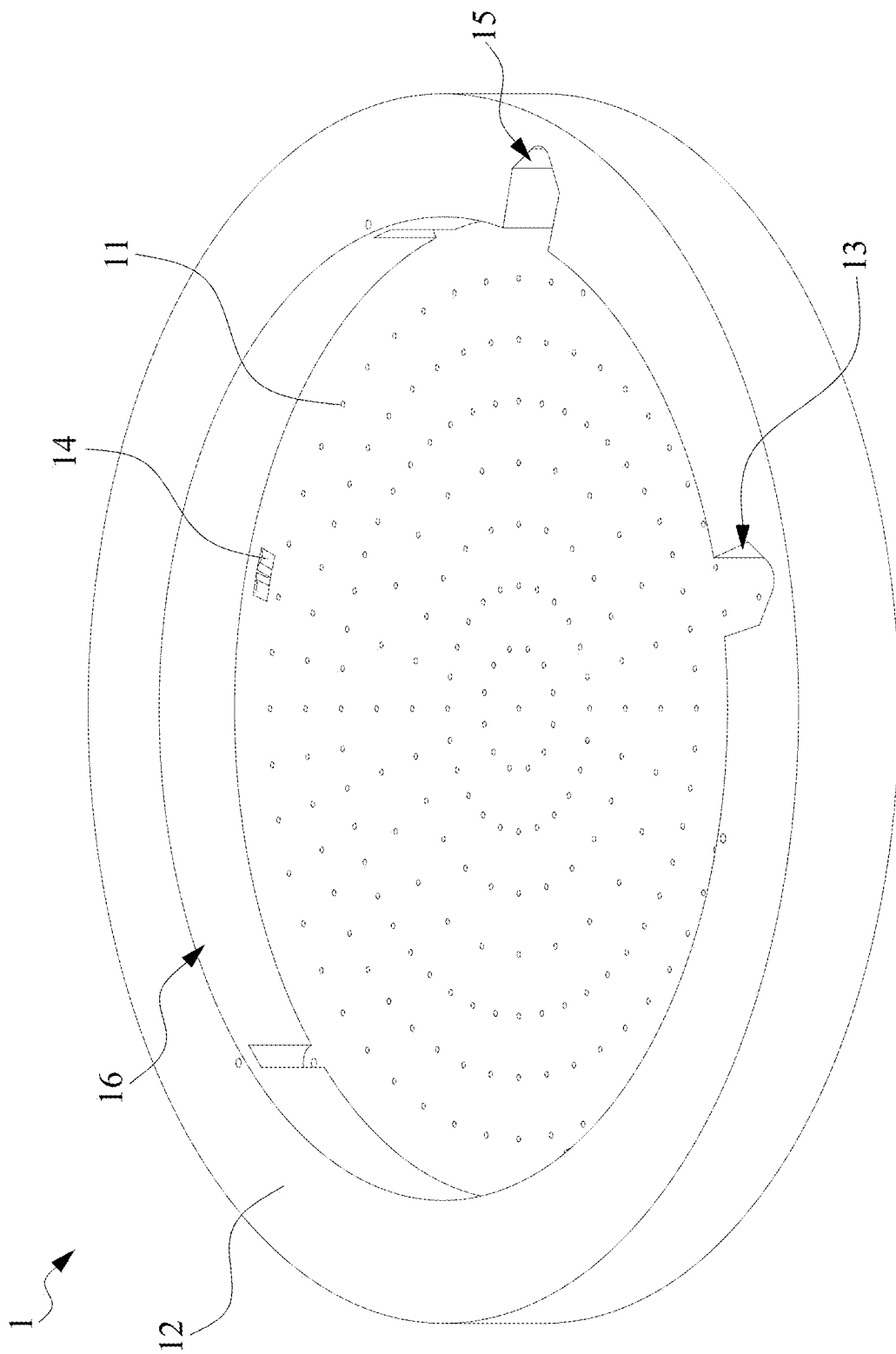
FIG. 2A is a schematic three-dimensional diagram of a first-layer panel of a gas showerhead according to an embodiment of this application.
Figure 2B:
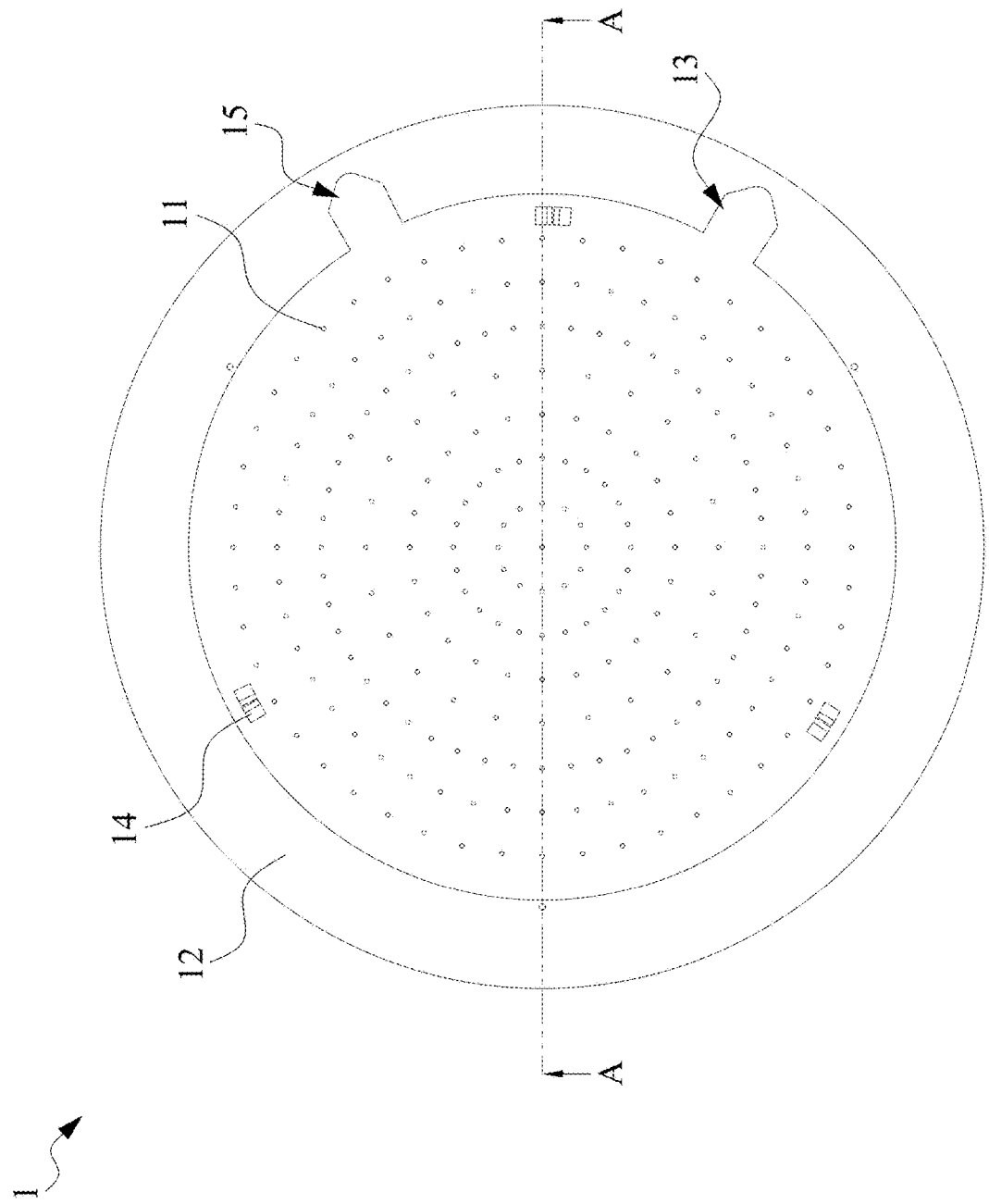
FIG. 2B is a schematic top view of the first-layer panel shown in FIG. 2A.
Figure 2C:
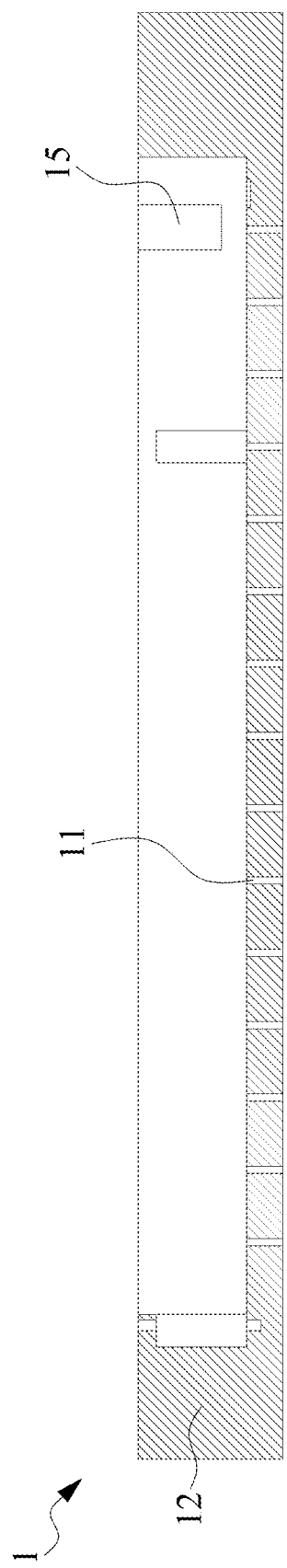
FIG. 2C is an enlarged cross-sectional view along A-A of FIG. 2B, which shows a cross-sectional structure of the first-layer panel.

FIG. 2A to FIG. 2C show the structure of the first-layer panel 1 of the gas showerhead in the foregoing preferred embodiment, where FIG. 2A is a schematic three-dimensional diagram of the first-layer panel 1, and FIG. 2B is a schematic top view of the first-layer panel 1 shown in FIG. 2A. The first-layer panel 1 is substantially disc-shaped, where a plurality of first gas supply holes 11 distributed according to a specific rule are formed in the middle part, and a plurality of wavy concave and convex portions 14 are formed in the middle part near an edge of the first-layer panel. The edge of the first-layer panel 1 has an annular peripheral wall 12 extending upward, thereby forming a concave cavity 16 in the middle of the first-layer panel 1, so that both the second-layer panel 2 and the third-layer panel 3 can be accommodated in the concave cavity 16. A first notch 13 and a second notch 15 facing inward are formed on an inner side of the annular peripheral wall 12, to respectively accommodate the rotating devices that drive the second-layer panel 2 and the third-layer panel 3 to rotate (details are described below). FIG. 2C is an enlarged cross-sectional view along A-A of FIG. 2B, which shows a cross-sectional structure of the first-layer panel 1.

Figure 3A:
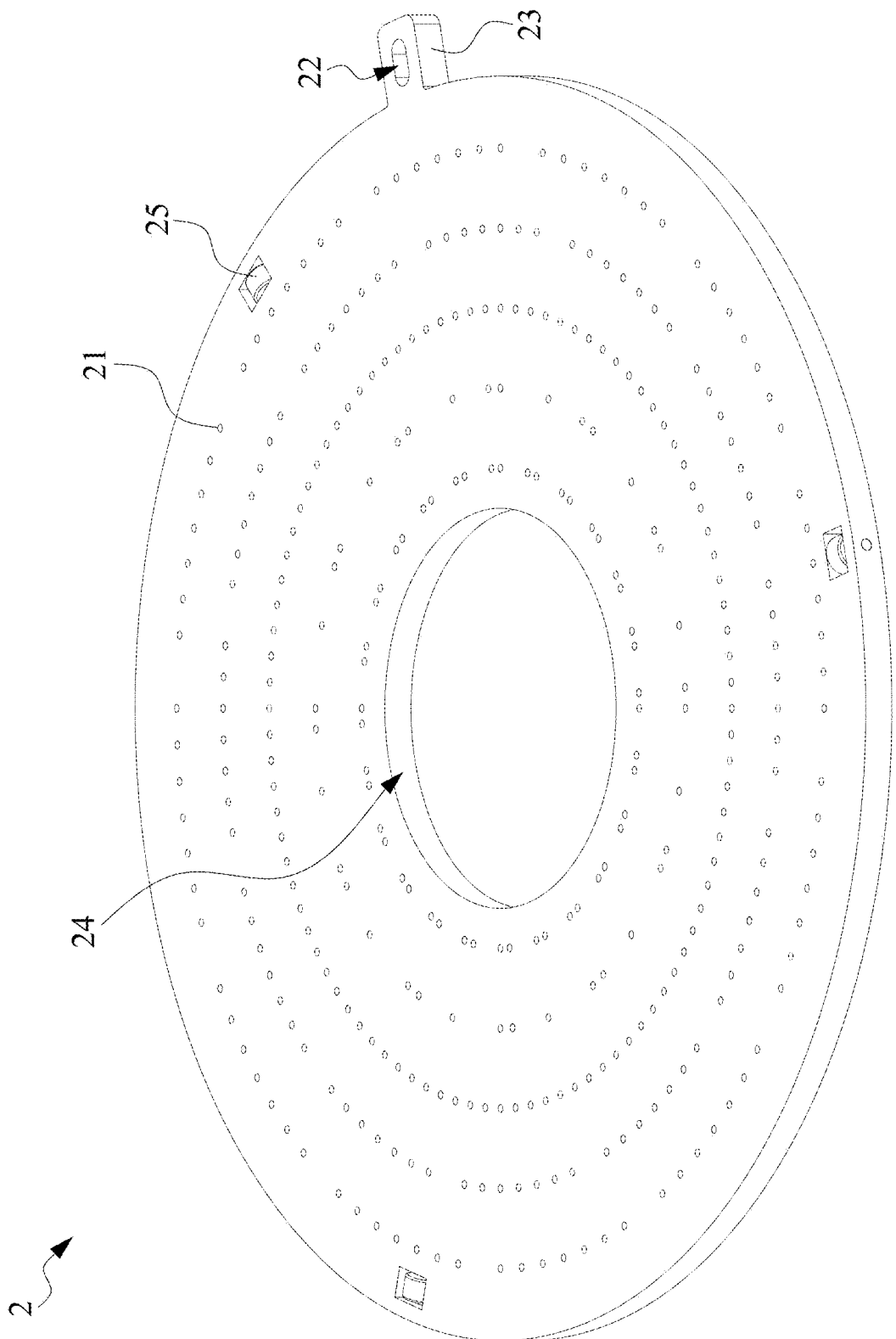
FIG. 3A is a schematic three-dimensional diagram of a second-layer panel of a gas showerhead according to an embodiment of this application.
Figure 3B:
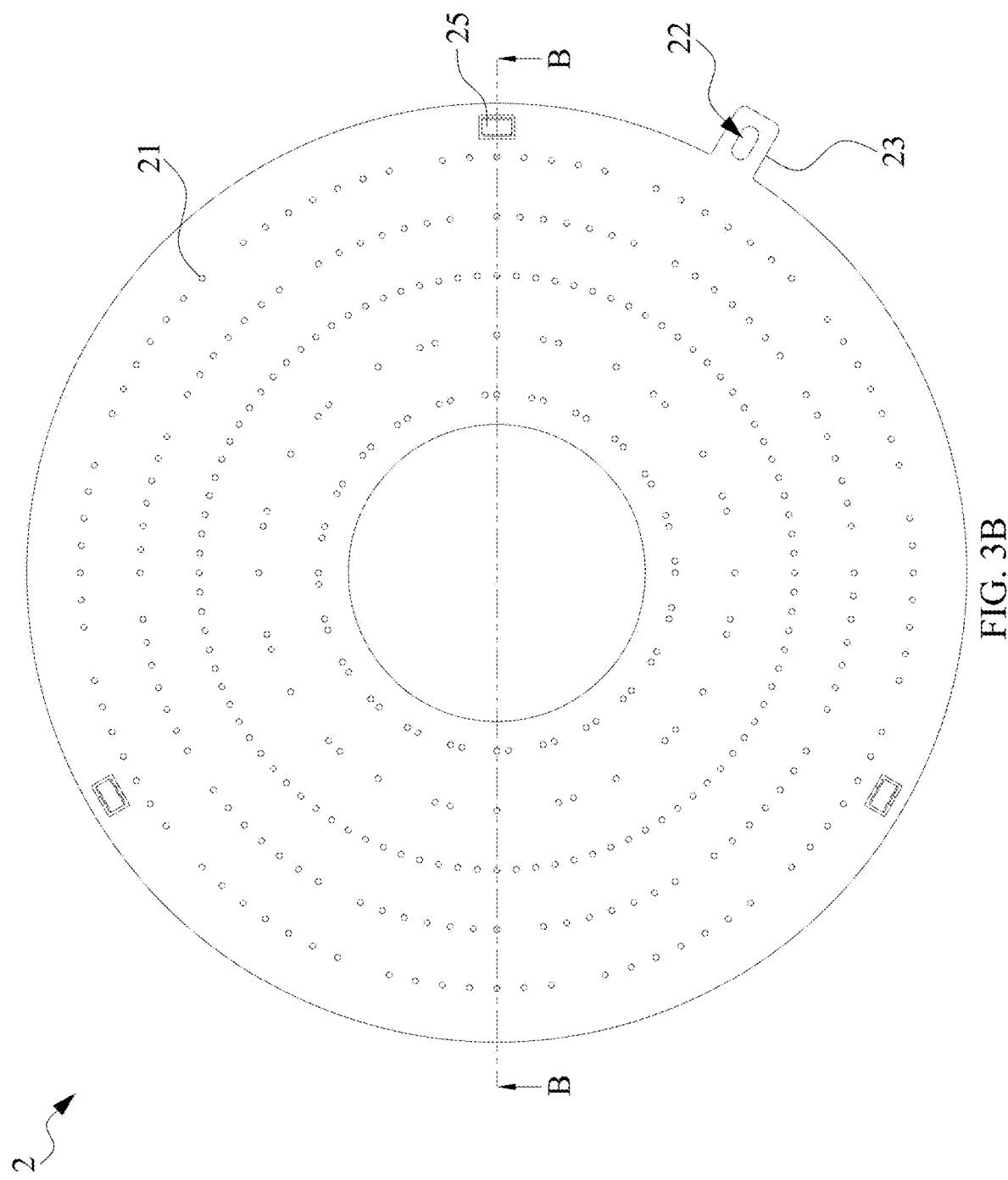
FIG. 3B is a schematic top view of the second-layer panel shown in FIG. 3A.
Figure 3C:
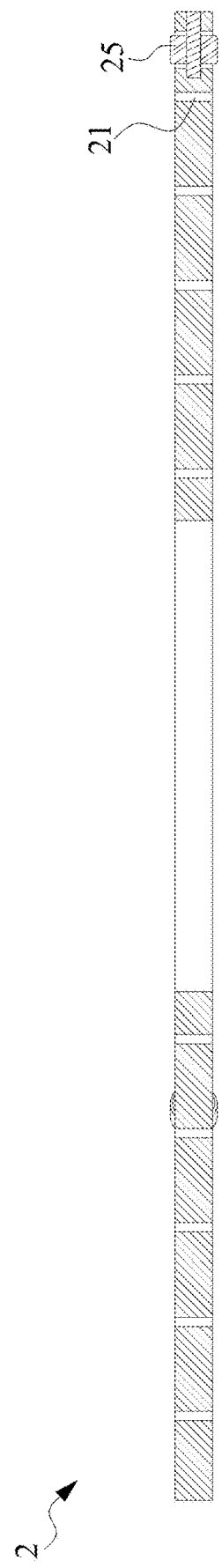
FIG. 3C is an enlarged cross-sectional view along B-B of FIG. 3B, which shows a cross-sectional structure of the second-layer panel.

FIG. 3A to FIG. 3C show the structure of the second-layer panel 2 of the gas showerhead in the foregoing preferred embodiment. The second-layer panel 2 is seated on the first-layer panel 1, is also substantially disc-shaped, and is provided with an opening 24 in the middle part. A plurality of second gas supply holes 21 are formed on the second-layer panel 2 according to a specific rule, and the distribution rule is different from the distribution rule of the gas supply holes 11 on the first-layer panel 1. The second-layer panel 2 further includes a lug 23 extending outward from an edge of the second-layer panel, and an elongated slot 22 is formed in the lug 23, to match the rotating device that drives the second-layer panel to rotate.

As shown in FIG. 3A to FIG. 3C, a rolling wheel 25 that can roll on the concave and convex portions 14 of the first-layer panel 1 is further disposed on the second-layer panel 2 near the edge, so that when the first-layer panel 1 and the second-layer panel 2 rotate relative to each other, the rolling wheel 25 rolls on the concave and convex portions 14. This structure can effectively reduce or even eliminate the direct friction between the first-layer panel 1 and the second-layer panel 2 when rotating relative to each other, and help reduce the wear of the two panels.

FIG. 4A to FIG. 4D show the structure of the third-layer panel 3 of the gas showerhead in the foregoing preferred embodiment. The third-layer panel 3 is seated on the second-layer panel 2, is also substantially disc-shaped, and is provided with an opening 34 in the middle part. A plurality of third gas supply holes 31 are formed on the third-layer panel 3 according to a specific rule, and the distribution rule is different from the distribution rules of the gas supply holes 11 and 21 on the first-layer panel 1 and the second-layer panel 2. The third-layer panel 3 also includes a lug 33 extending outward from an edge of the second-layer panel, and an elongated slot 32 is formed in the lug 33, to match the rotating device that drives the second-layer panel to rotate.

Figure 4A:
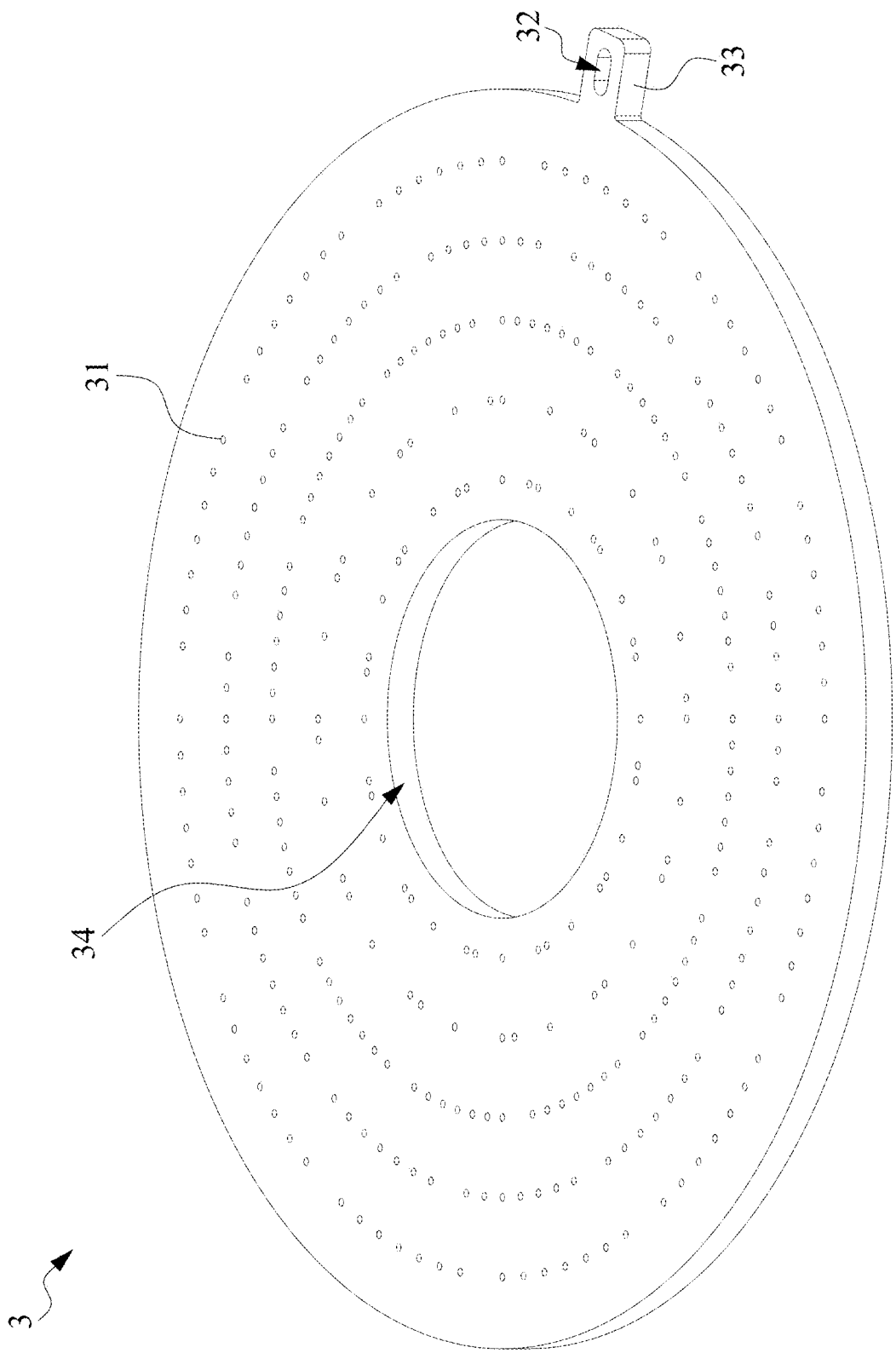
FIG. 4A is a schematic three-dimensional diagram of a third-layer panel of a gas showerhead according to an embodiment of this application.
Figure 4B:
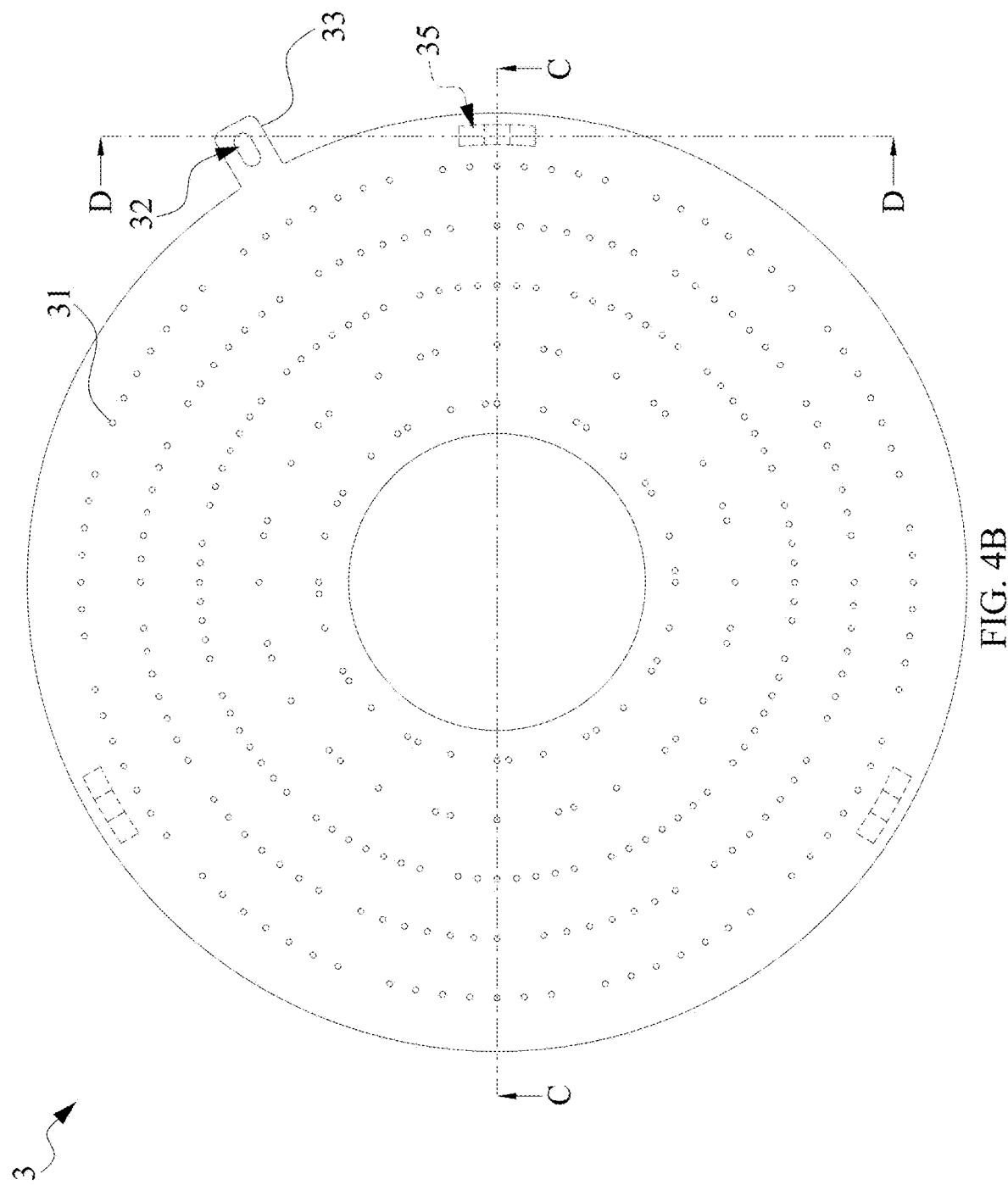
FIG. 4B is a schematic top view of the third-layer panel shown in FIG. 4A.
Figure 4C:
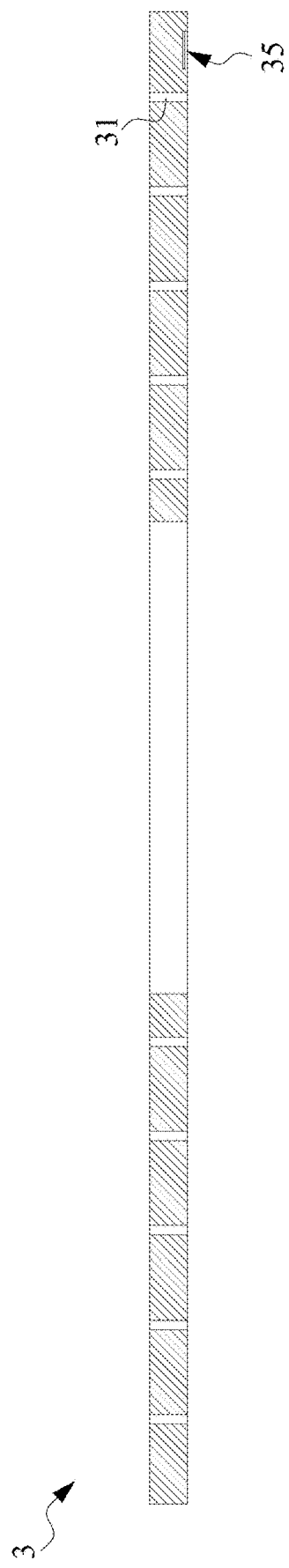
FIG. 4C is an enlarged cross-sectional view along C-C of FIG. 4B, which shows a cross-sectional structure of the third-layer panel.

Referring to FIG. 4C and FIG. 4D, a plurality of wavy concave and convex portions 35 are formed on a lower surface of the third-layer panel 3, and the concave and convex portions 35 can match the rolling wheel 25. Therefore, when the third-layer panel 3 and the second-layer panel 2 rotate relative to each other, the rolling wheel 25 rolls on the concave and convex portions 35. This structure can effectively reduce or even eliminate the direct friction between the third-layer panel 3 and the second-layer panel 2 when rotating relative to each other, and help reduce the wear of the two panels.

The overall structure, working process, and principle of the gas showerhead in the foregoing preferred embodiment are described in detail below.

FIG. 5A to FIG. 5D, FIG. 6A to FIG. 6D, and FIG. 7A to FIG. 7D show schematic diagrams of the overall gas showerhead of this application.

Figure 5A:
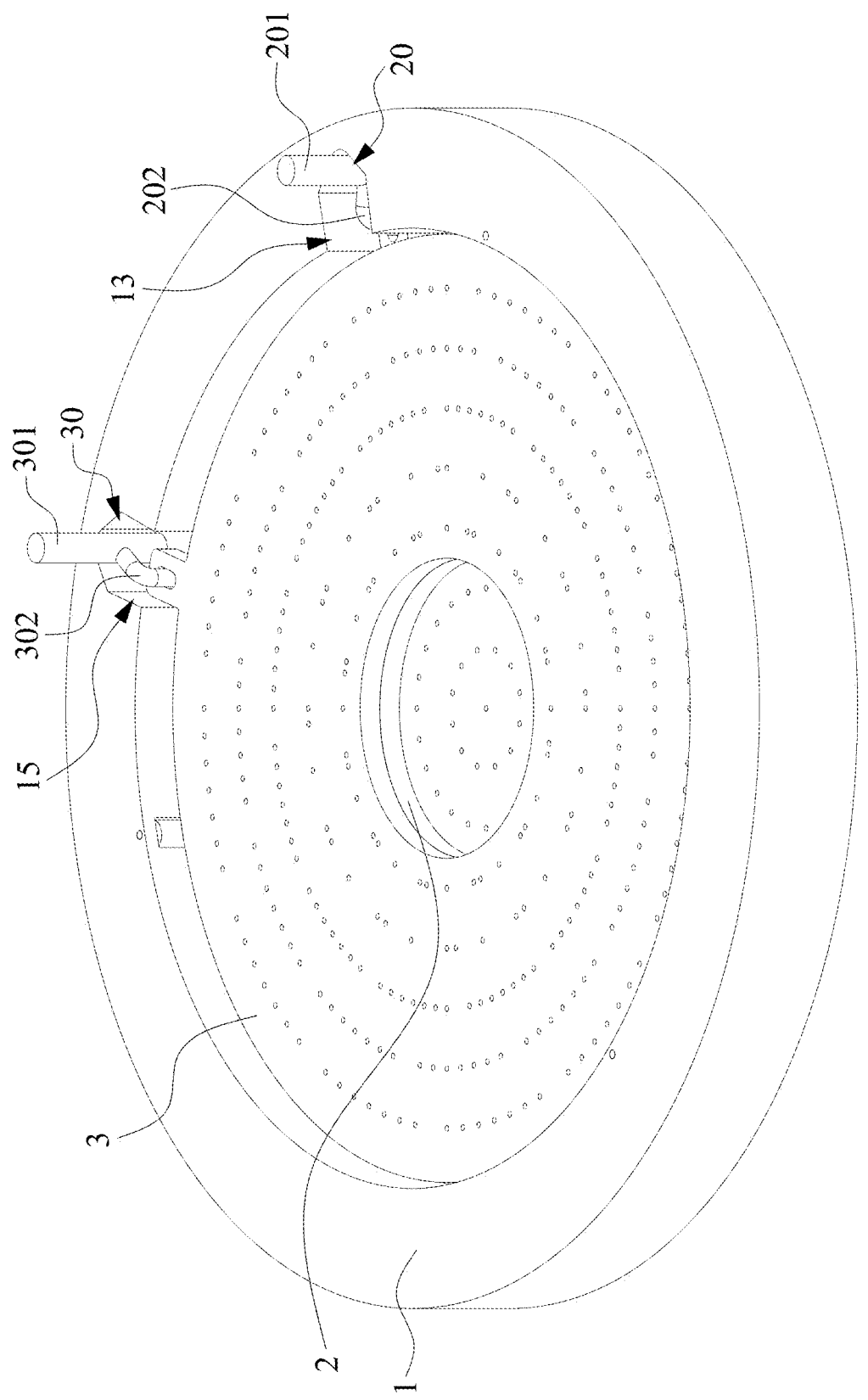
FIG. 5A is a schematic three-dimensional diagram of an entire gas showerhead according to an embodiment of this application, where the gas showerhead includes three layers of panels, and a combination state shown in the figure is that all through holes in a first-layer panel are in an unblocked state.

First, FIG. 5A shows the overall structure of the gas showerhead. As shown in FIG. 5A, the gas showerhead includes a first-layer panel 1, a second-layer panel 2, and a third-layer panel 3 sequentially stacked and substantially concentrically arranged, where the second-layer panel 2 and the third-layer panel 3 are located in a concave cavity 16 formed on an annular peripheral wall 12 of the first-layer panel 1. In this embodiment, the first-layer panel 1 is stationary. The second-layer panel 2 and the third-layer panel 3 can rotate at least by a specific angle.

The second-layer panel 2 is capable of being driven by a first rotating device 20 to rotate. The first rotating device 20 is adjacent to an edge of the second-layer panel 2, and includes a rotating column 201 capable of being driven to rotate and a control column 202 fixedly connected to or integrally formed with the rotating column 201. As described above, an elongated slot 22 matching the control column 202 is formed on the second-layer panel 2, so that when the rotating column 201 is driven to rotate, the control column 202 matching the elongated slot 22 drives the second-layer panel 2 to rotate. As described above, the elongated slot 22 is formed in the lug 23. The rotating column 201, the control column 202, and the lug 23 are all located in the first notch 13. The width of the first notch 13 is greater than the width of the lug 23, so that the second-layer panel 2 is capable of rotating by 3°-5° relative to the first-layer panel 1.

Similarly, the third-layer panel 3 is capable of being driven by a second rotating device 30 to rotate. Similar to the first rotating device 20, the second rotating device 30 is adjacent to an edge of the third-layer panel 3, and includes a rotating column 301 capable of being driven to rotate and a control column 302 fixedly connected to or integrally formed with the rotating column 301; and an elongated slot 32 matching the control column 302 is formed on the third-layer panel 3, so that when the rotating column 301 is driven to rotate, the control column 302 matching the elongated slot 32 drives the third-layer panel 3 to rotate. As shown in the figure, the elongated slot 32 is formed in the lug 33. The rotating column 301, the control column 302, and the lug 33 are all located in the second notch 15. As shown in the figure, the width of the second notch 15 is greater than the width of the lug 33, so that the third-layer panel 3 is capable of rotating by 3°-5° relative to the first-layer panel 1.

Figure 5B:
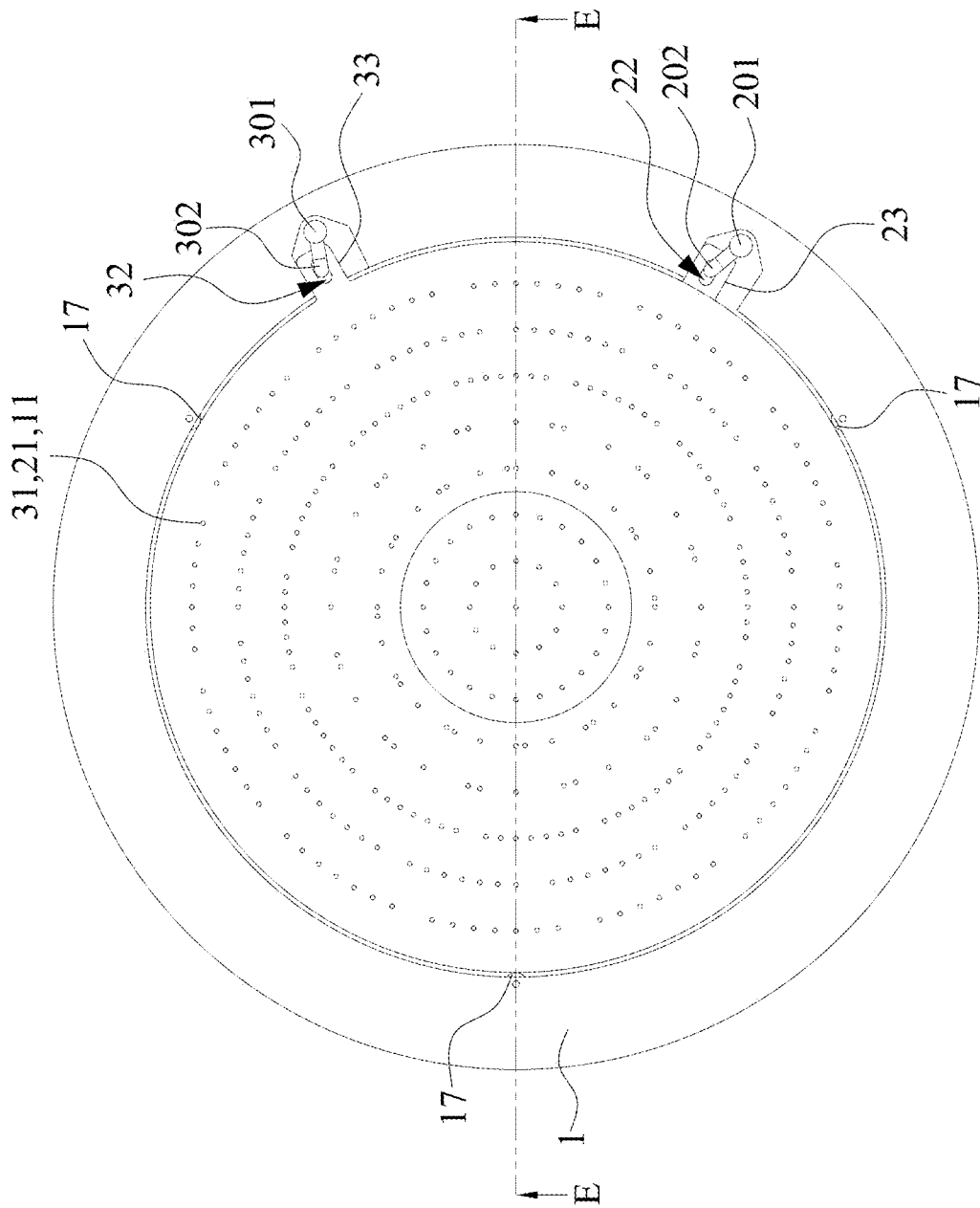
FIG. 5B is a schematic top view of the gas showerhead shown in FIG. 5A.
Figure 5C:
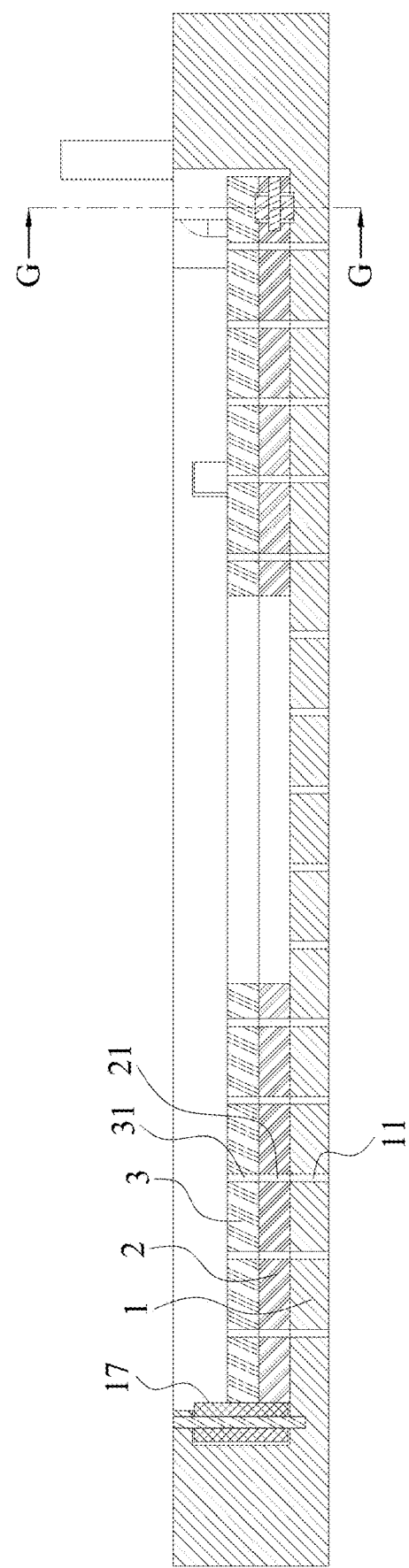
FIG. 5C is an enlarged cross-sectional view along E-E of FIG. 5B, which particularly shows that corresponding through holes on the three layers of panels are aligned and penetrated.

As shown in FIG. 5A and FIG. 5B, a plurality of rolling columns 17 are disposed on an inner side of the annular peripheral wall 12 of the first-layer panel 1, the plurality of rolling columns 17 protruding from an inner surface of the annular peripheral wall 12 and being in close contact with the edges of the second-layer panel 2 and the third-layer panel 3 to provide positioning therefor and maintaining centering. In addition, rolling friction are generated during rotation of the two panels, thereby avoiding sliding friction with the inner surface of the annular peripheral wall 12. Therefore, it is helpful for production operations and prolongs the service life of each layer of panel.

Combination State without Blocking

Figure 5D:
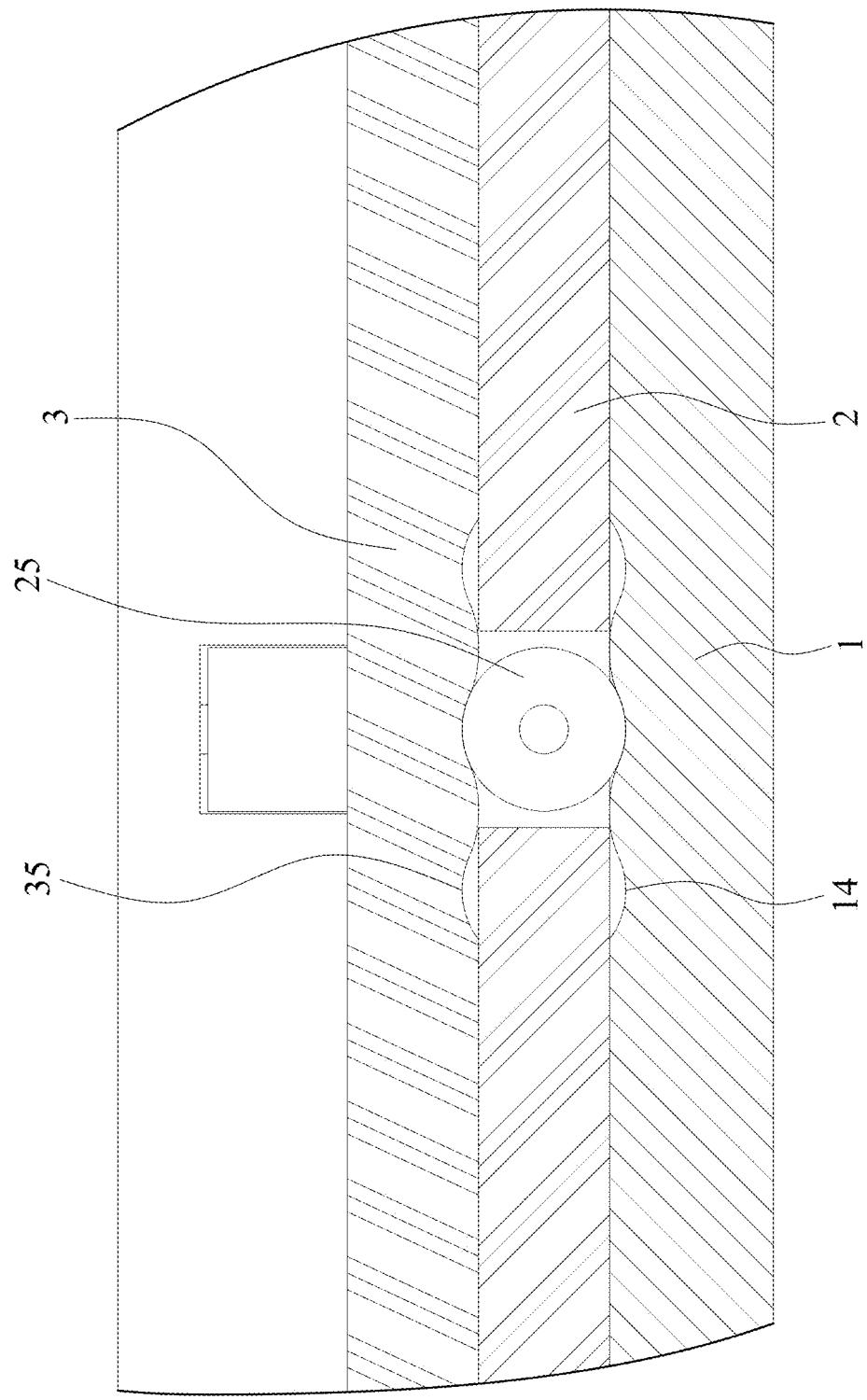
FIG. 5D is an enlarged cross-sectional view along G-G of FIG. 5C, which particularly shows a position of a rolling wheel.

In the combination state shown in FIG. 5A to FIG. 5D, all the gas supply holes 11 on the first-layer panel 1 are in an unblocked state, and in this case, the second-layer panel 2 and the third-layer panel 3 are not rotated (for example, at original positions). The position of the rolling wheel 25 in this case is shown in FIG. 5D. As can be seen from FIG. 5D, the concave and convex portions 14 on the first-layer panel 1 and the concave and convex portions 35 on the third-layer panel both have one or more wave crests and wave troughs. In this case, the rolling wheel 25 is located in the wave troughs of the concave and convex portions 14 and 35, so that the lower surface of the second-layer panel 2 and the upper surface of the first-layer panel 1 are in close contact, and the lower surface of the third-layer panel 3 and the upper surface of the second-layer panel 2 are in close contact. In this way, gas leakage between the panels can be effectively avoided.

In addition, when the first-layer panel 1, the second-layer panel 2, and the third-layer panel 3 rotate by a specific angle relative to each other, the rolling wheel 25 rolls in the concave and convex portions 14 and 35. Specifically, during the rotation, the rolling wheel 25 roll over the wave crests, to be fixed after reaching the next wave trough. Therefore, during the rotation, there are gaps among the first-layer panel 1, the second-layer panel 2, and the third-layer panel 3, thereby avoiding friction.

Combined State where Blocking by the Second-Layer Panel 2

In the combined state shown in FIG. 5A to FIG. 5D, if the first rotating device 20 is driven to rotate (for example, by virtue of a controller 40 (for example, a motor) shown in FIG. 1, which is not the focus of this application, and is thus not detailed) so that the second-layer panel 2 rotates by a specific angle (for example, four degrees), the state shown in FIG. 6A to FIG. 6D is reached.

Figure 6A:
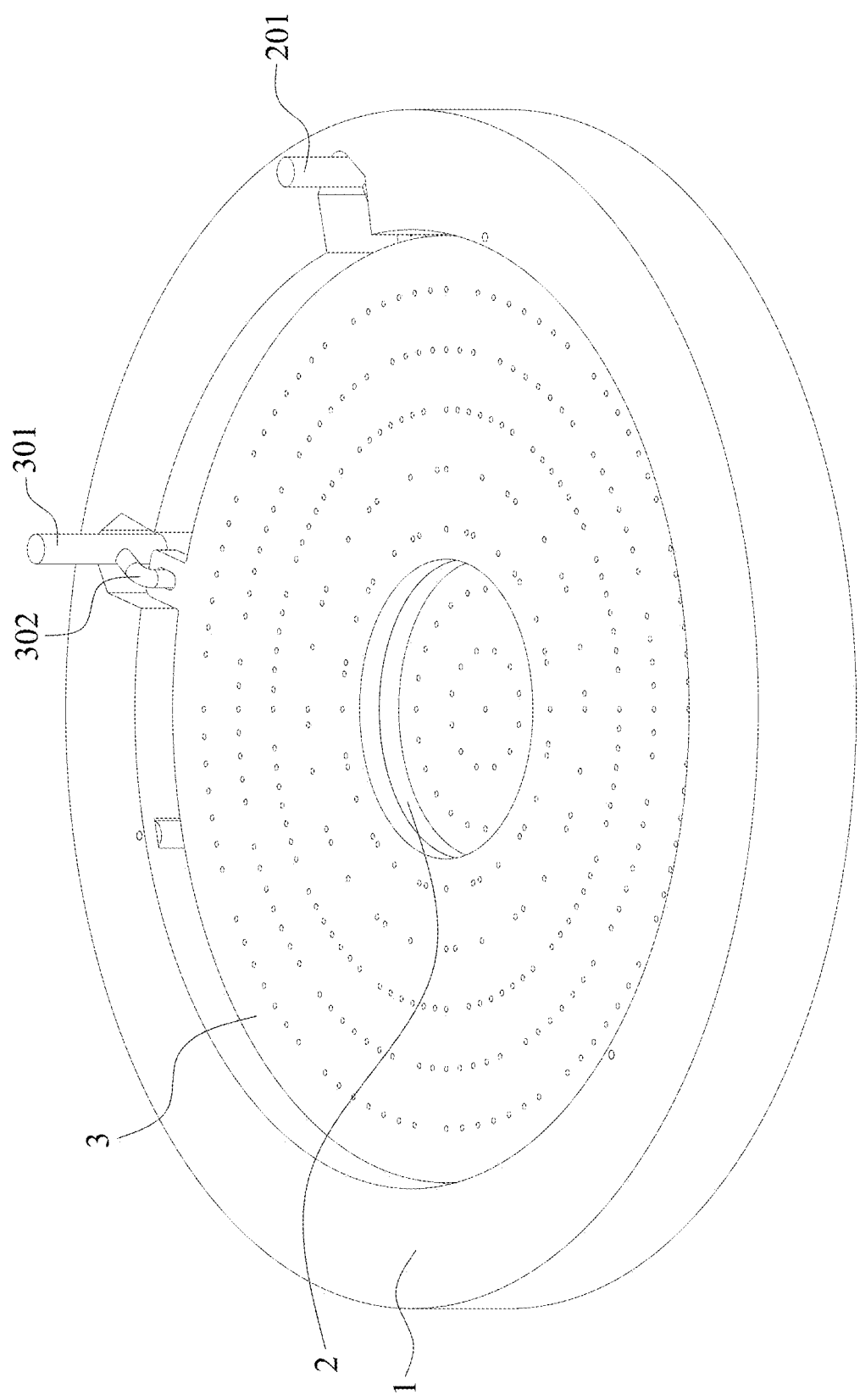
FIG. 6A is also a schematic three-dimensional diagram of the gas showerhead shown in FIG. 5A to FIG. 5D, where the difference from FIG. 5A to FIG. 5D is that a second-layer panel rotates to an angle, thereby blocking a part of the through holes of the first-layer panel.
Figure 6B:
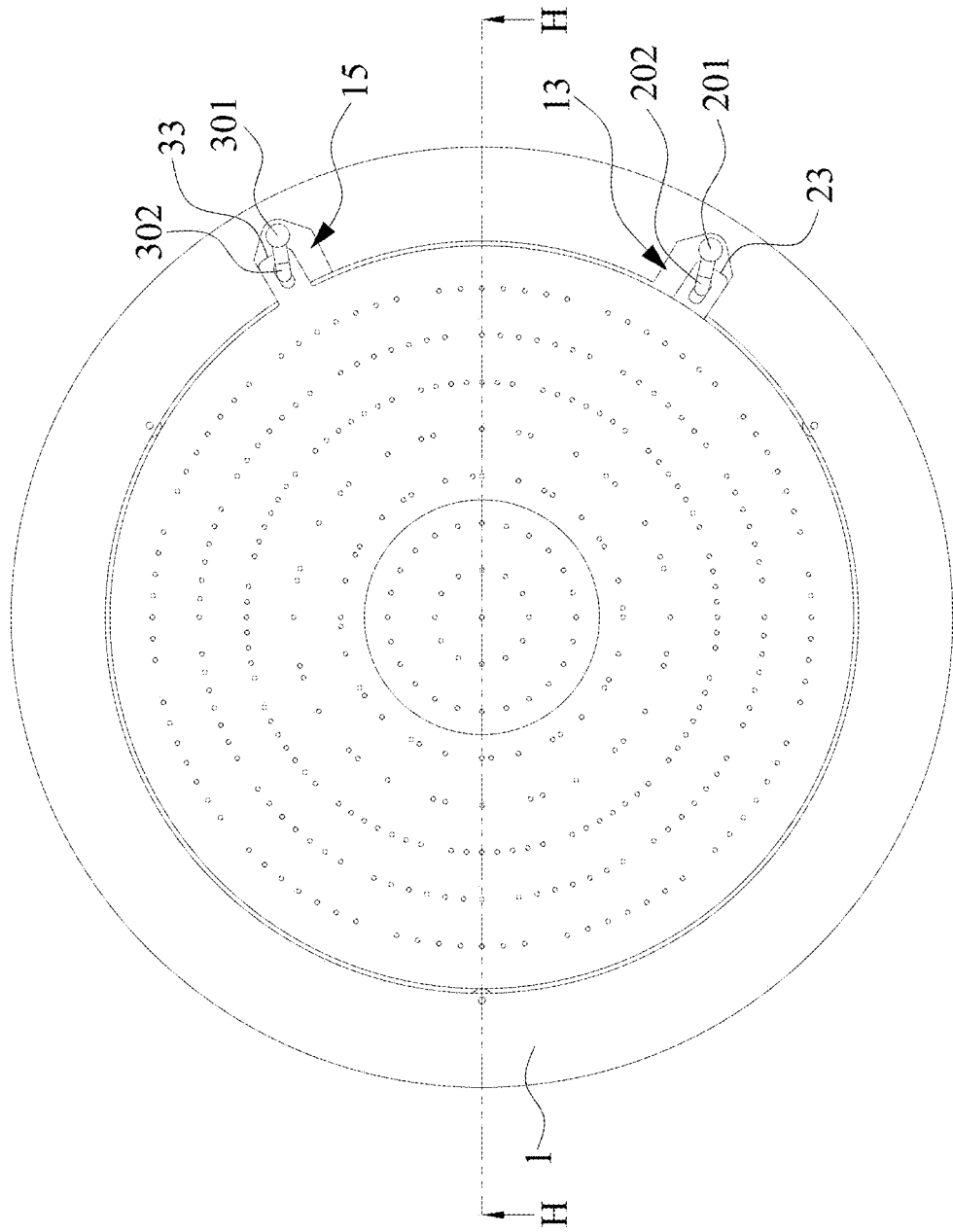
FIG. 6B is a schematic top view of the gas showerhead shown in FIG. 6A.
Figure 6C:
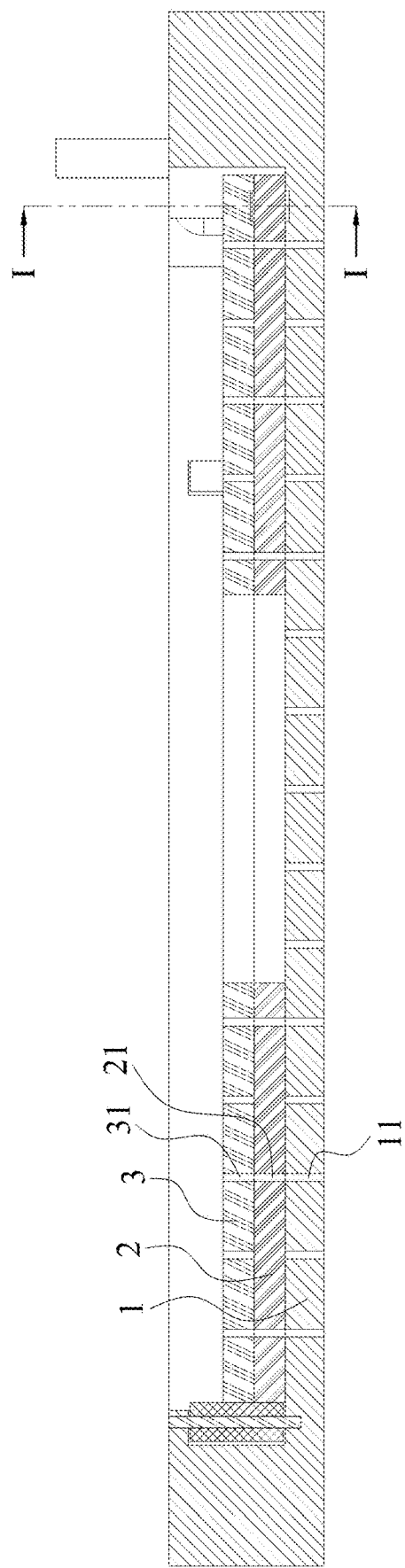
FIG. 6C is an enlarged cross-sectional view along H-H of FIG. 6B, which particularly shows that a part of the through holes of the first-layer panel are blocked by the second-layer panel.
Figure 6D:
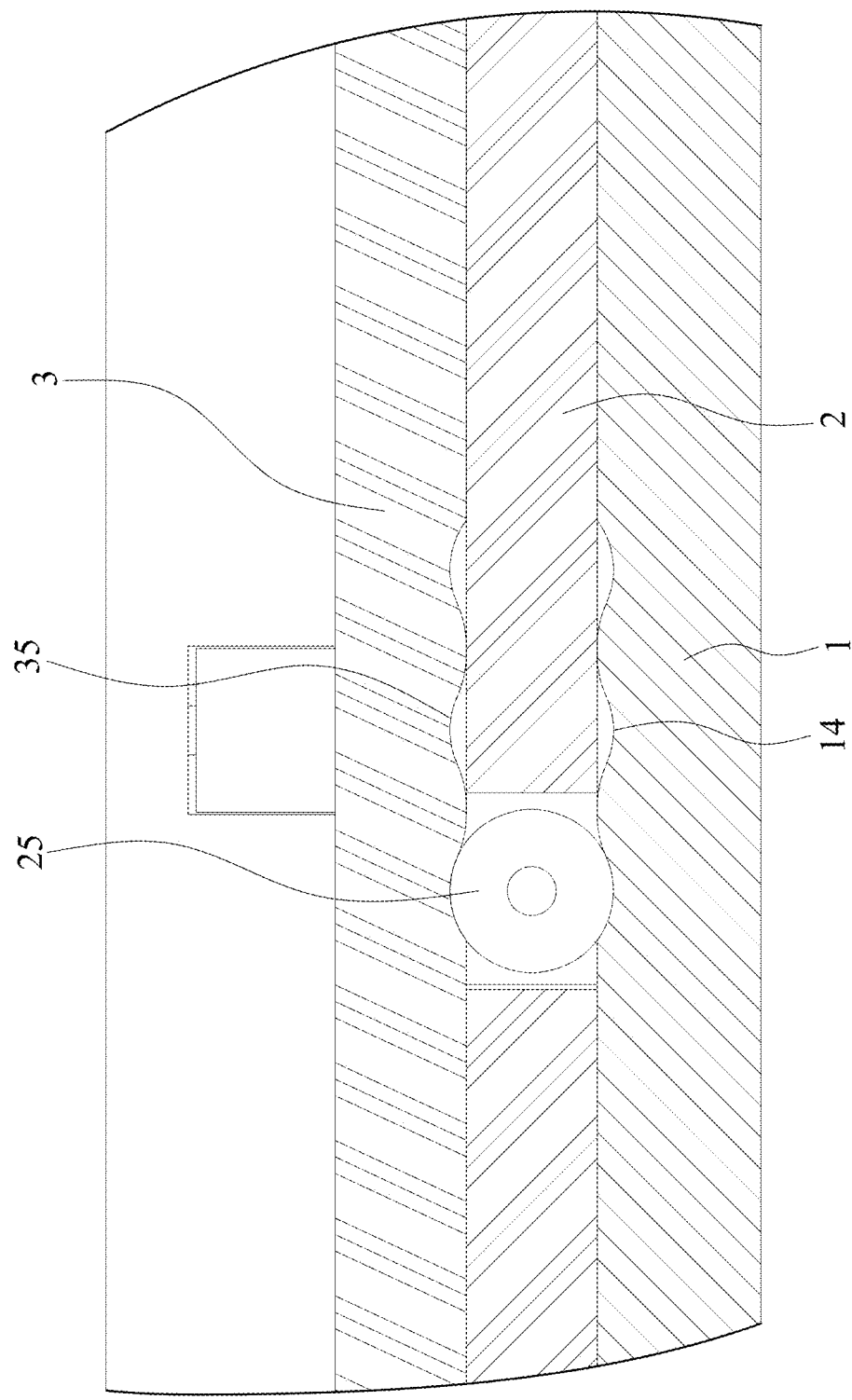
FIG. 6D is an enlarged cross-sectional view along I-I of FIG. 6C, which particularly shows a position of the rolling wheel.

Referring to FIG. 6A to FIG. 6C, in this case, the second-layer panel 2 blocks a portion of the gas supply holes 11 of the first-layer panel 1 (referring to FIG. 6C in particular). As shown in FIG. 6B, in this case, the rotating column 201 and the control column 202 have caused the lug 23 of the second-layer panel 2 to move to close to the bottom position in the first notch 13 of the first-layer panel 1 in the figure. As shown in FIG. 6D, in this case, the rolling wheel 25 has moved to another wave trough (the wave trough on the far left in the figure) located at the concave and convex portions 14 and 35, the lower surface of the second-layer panel 2 and the upper surface of the first-layer panel 1 are in close contact, and the lower surface of the third-layer panel 3 and the upper surface of the second-layer panel 2 are in close contact.

Combined State where Blocking by the Third-Layer Panel 3

In the combined state shown in FIG. 5A to FIG. 5D, if the second rotating device 30 is driven to rotate (for example, by virtue of the controller 40 (for example, a motor) shown in FIG. 1, which is not the focus of this application, and is thus not detailed) so that the third-layer panel 3 rotates by a specific angle (for example, four degrees), the state shown in FIG. 7A to FIG. 7D is reached.

Figure 7A:
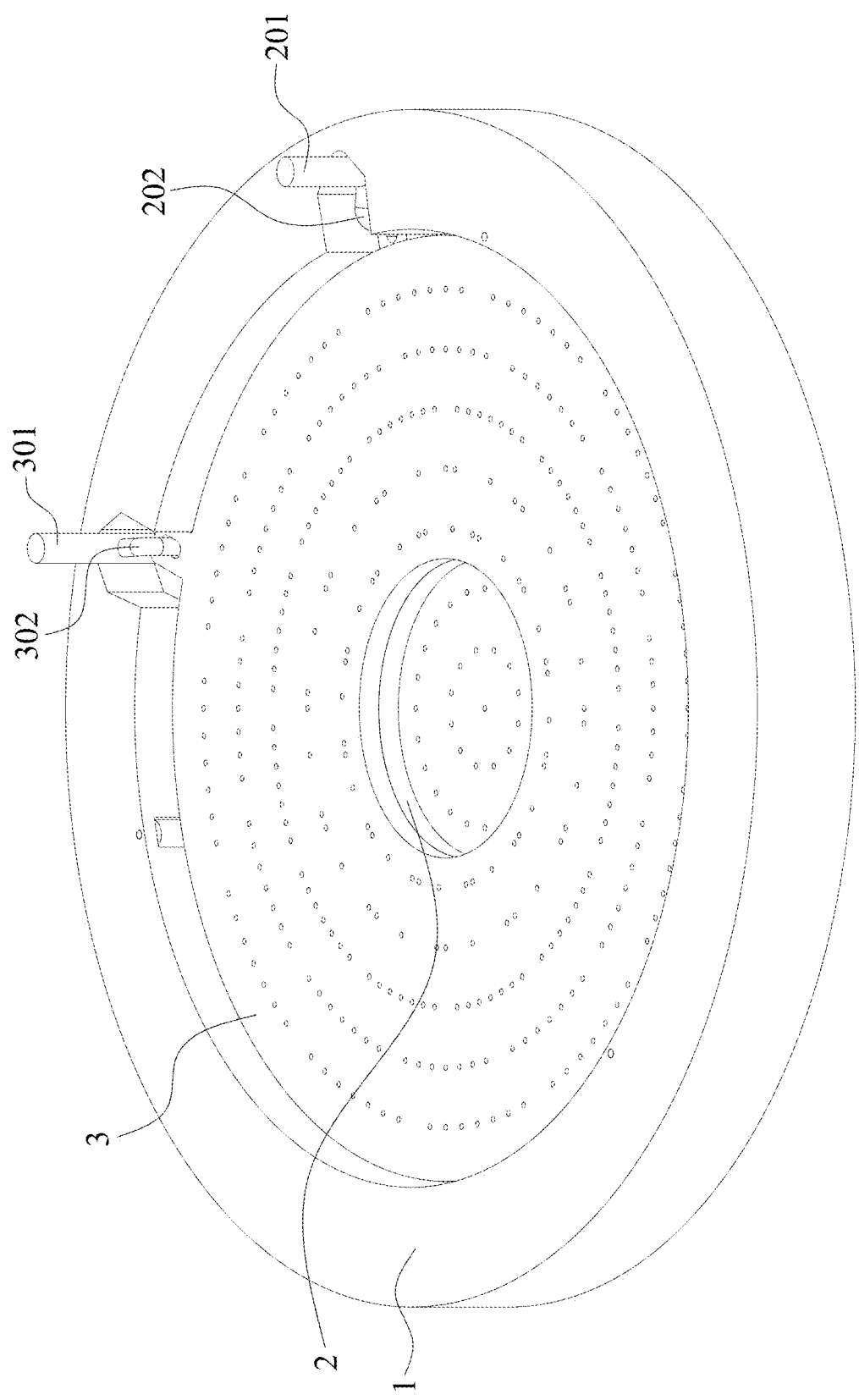
FIG. 7A is also a schematic three-dimensional diagram of the gas showerhead shown in FIG. 5A to FIG. 5D, where the difference from FIG. 5A to FIG. 5D is that a third-layer panel rotates to an angle, thereby blocking a part of the through holes of the first-layer panel and the second-layer panel.
Figure 7B:
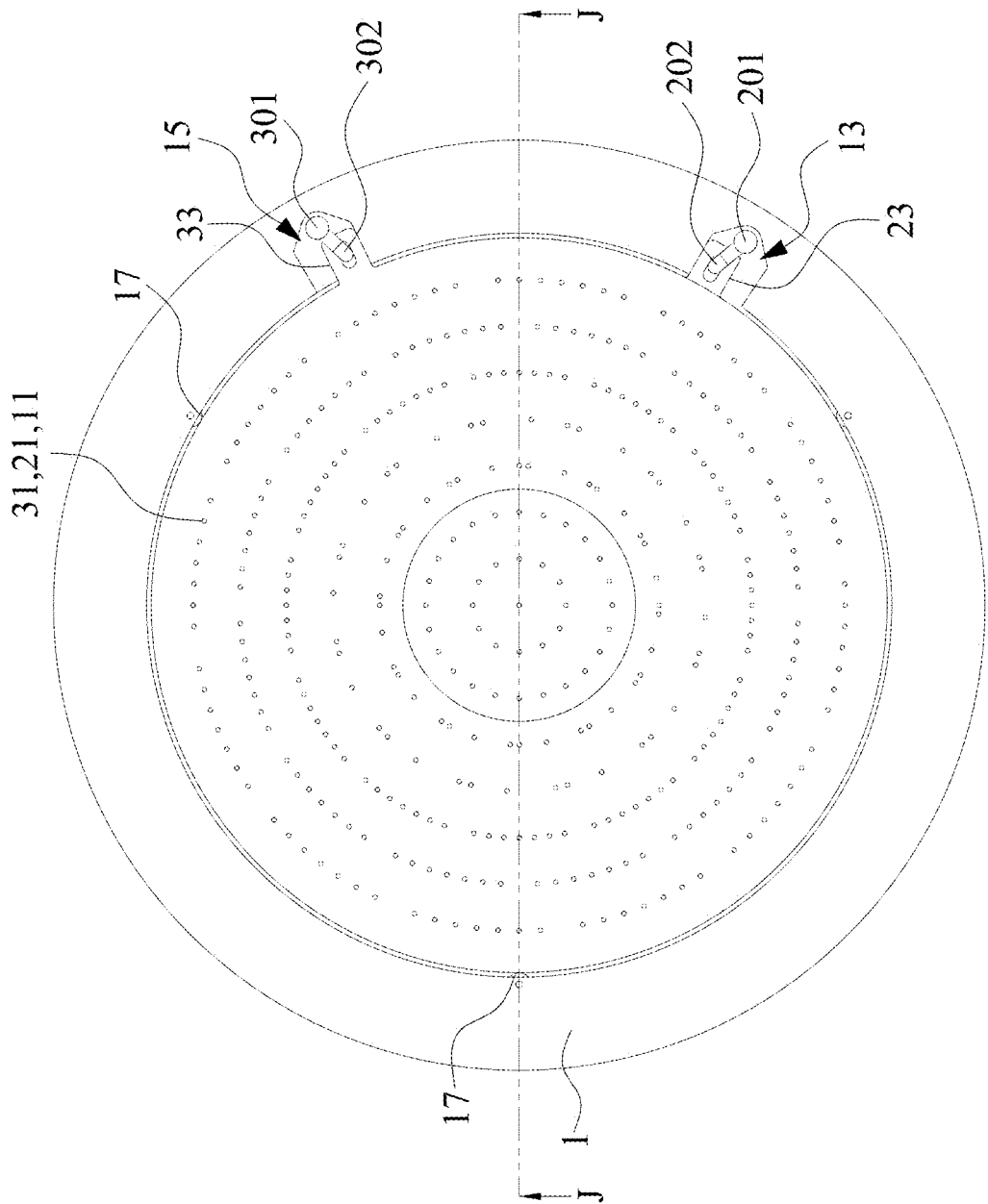
FIG. 7B is a schematic top view of the gas showerhead shown in FIG. 7A.
Figure 7C:
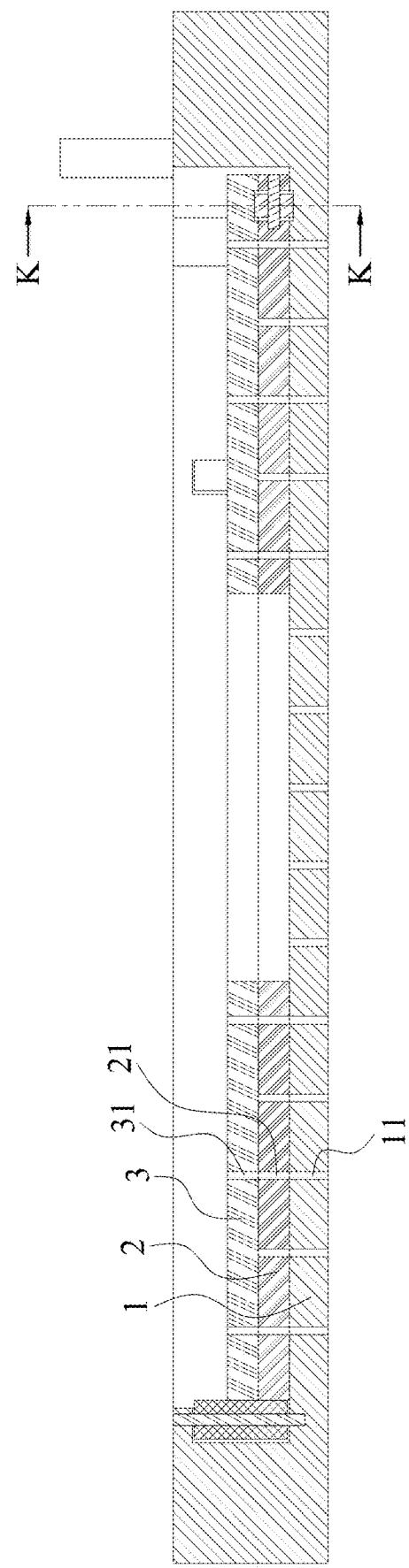
FIG. 7C is an enlarged cross-sectional view along J-J of FIG. 7B, which particularly shows that a part of the through holes of the first-layer panel and the second-layer panel are blocked by the third-layer panel.
Figure 7D:
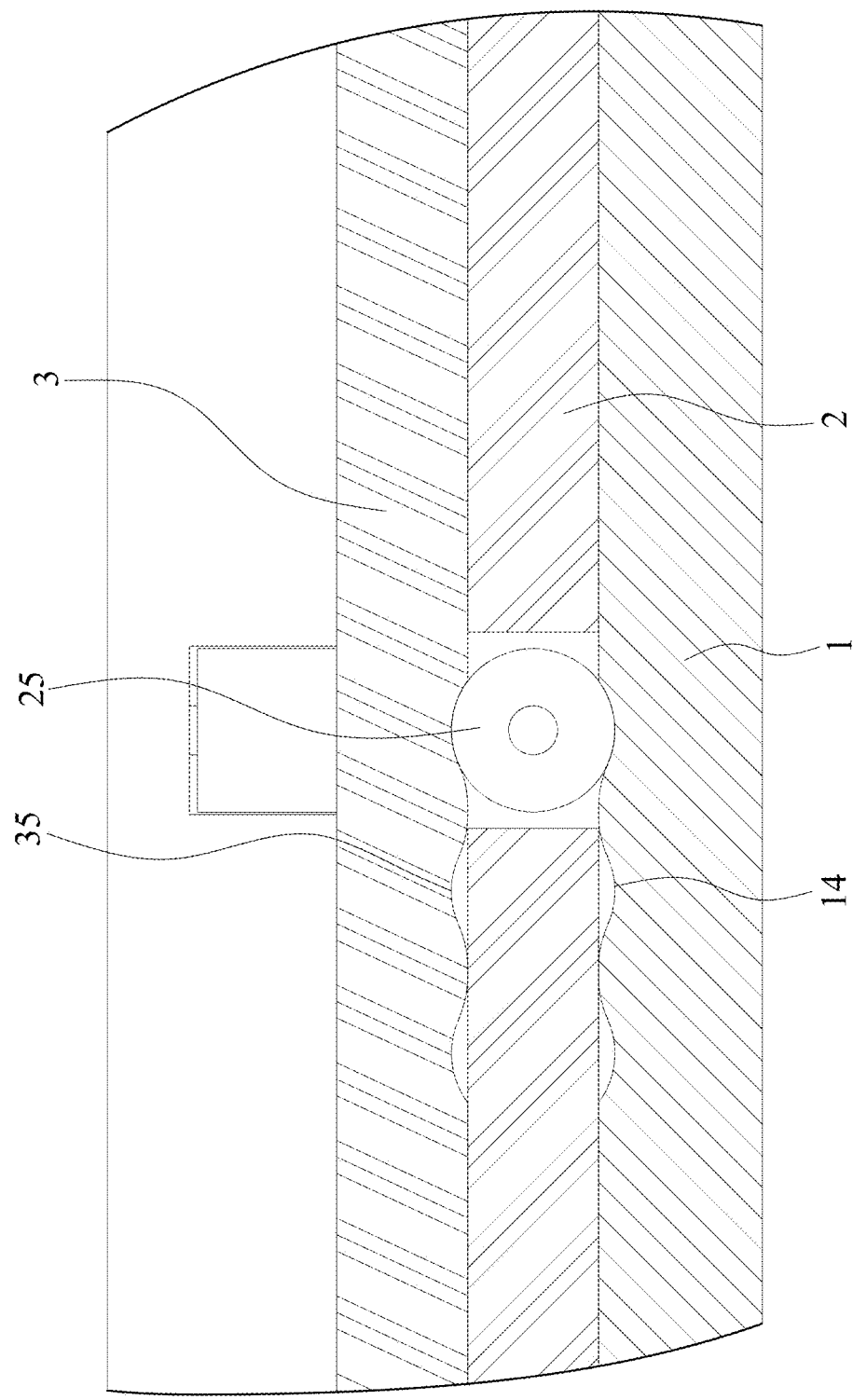
FIG. 7D is an enlarged cross-sectional view along K-K of FIG. 7C, which particularly shows a position of the rolling wheel.

Referring to FIG. 7A to FIG. 7B, in this case, the rotating column 301 and the control column 302 have caused the lug 33 of the third-layer panel 3 to move to the bottom position in the second notch 15 of the first-layer panel 1. Referring to FIG. 7C, in this case, the third-layer panel 3 blocks a portion of the gas supply holes 11 of the first-layer panel 1 and a portion of the gas supply holes 21 of the second-layer panel 2. As shown in FIG. 7D, in this case, the rolling wheel 25 has moved to another wave trough (the wave trough on the far right in the figure) located at the concave and convex portions 14 and 35. In addition, as at the previous position, the lower surface of the second-layer panel 2 and the upper surface of the first-layer panel 1 are in close contact, and the lower surface of the third-layer panel 3 and the upper surface of the second-layer panel 2 are in close contact.

As can be learned from the foregoing description, by rotating the second-layer panel 2 and the third-layer panel 3 for a specific angle, one can achieve the purpose of adjusting the quantity and distribution of the gas supply holes of the gas showerhead, thereby adjusting the spraying volume and the spraying position. Such flexibility not only helps to meet the spraying requirements of different thin film deposition processes, but also helps to improve the uniformity of a deposited thin film. Therefore, the gas showerhead is suitable for the development of novel film deposition processes, and reduces the costs of developing the novel film deposition processes.

Figure 8:
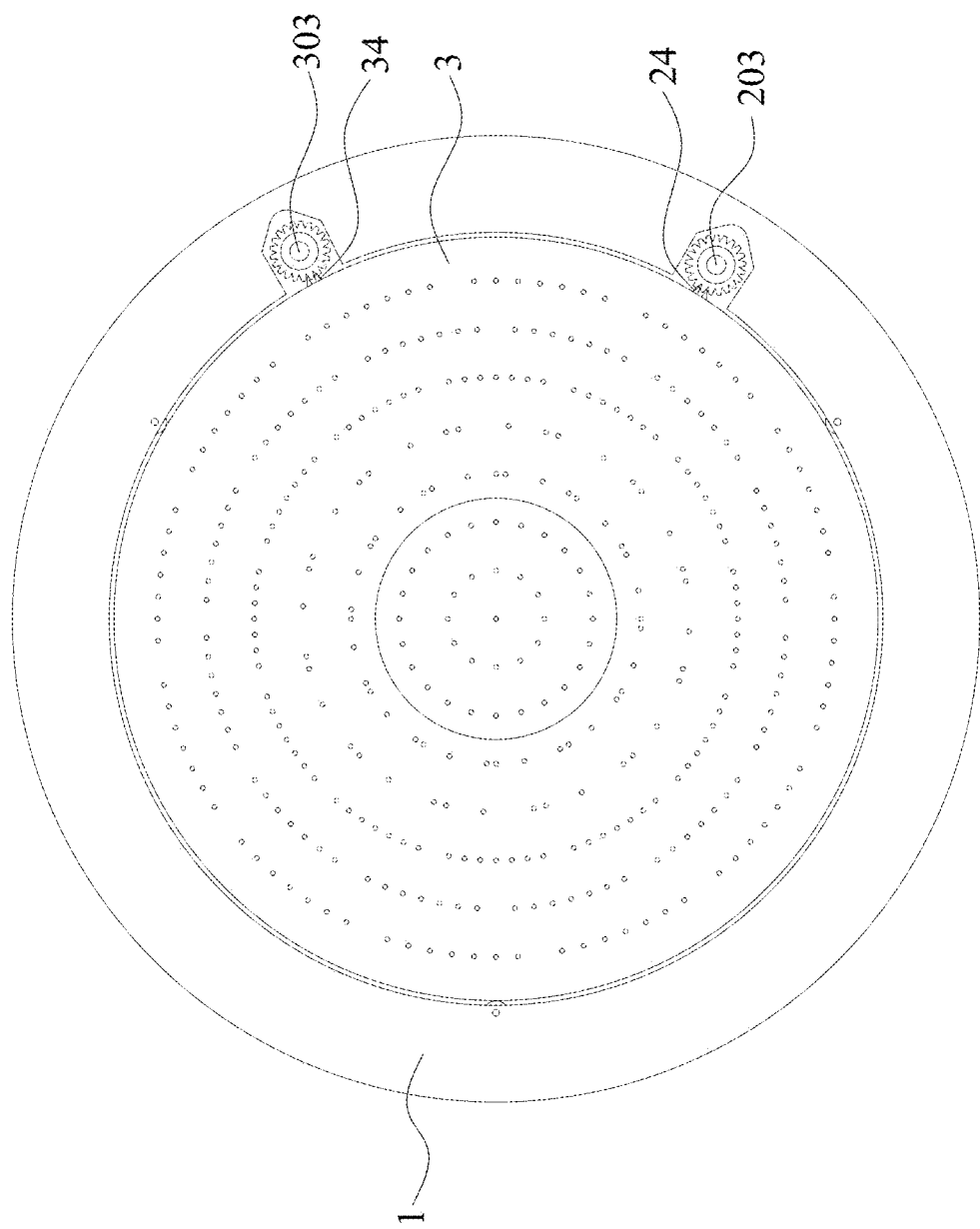
FIG. 8 shows another embodiment of this application, where a first-layer panel and a second-layer panel are driven by gears.

Referring to FIG. 8, as an alternative embodiment of the foregoing embodiment, different from the foregoing embodiment, the first rotating device 20 and the second rotating device 30 are both made of gears.

Specifically, the first rotating device 20 is adjacent to an edge of the second-layer panel 2 and includes a gear 203; and the edge of the second-layer panel 2 includes a plurality of teeth 24 meshing with the gear 203, so that when the gear 203 is driven to rotate, the teeth 24 drive the second-layer panel 2 to rotate.

Similarly, the second rotating device 30 is adjacent to an edge of the third-layer panel 3 and includes a gear 303; and the edge of the third-layer panel 3 includes a plurality of teeth 34 meshing with the gear 303, so that when the gear 303 is driven to rotate, the teeth 34 drive the third-layer panel 3 to rotate.

Similarly, the gears 203 and 303 may also be driven by the controller 40 shown in FIG. 1 to rotate, thereby driving the second-layer panel 2 and the third-layer panel 3 to rotate. The angle of rotation is substantially the same as that of the foregoing embodiment. This can be achieved by designing the quantity of the teeth 24 and 34.

Therefore, this alternative embodiment can also achieve similar technical effects as the foregoing embodiment. That is, by rotating the second-layer panel 2 and the third-layer panel 3, one can adjust the distribution of the gas supply holes that can be used to spray the gas, which can meet the spraying requirements of different thin film deposition processes, and helps to improve the uniformity of a deposited thin film. Therefore, the gas showerhead is suitable for the development of novel film deposition processes, and reduces the costs of developing the novel film deposition processes.

Technical content and technical features of this application are described by the foregoing related embodiments. However, the foregoing embodiments are merely examples for implementing this application. A person skilled in the art may still make replacements and modifications based on the teachings and the disclosure of this application without departing from the spirit of this application. Therefore, the disclosed embodiments of this application do not limit the scope of this application. On the contrary, modifications and equivalent arrangements included in the spirit and scope of the claims are all included in the scope of this application.

What is claimed:

1. A gas showerhead with controllable airflow distribution, the gas showerhead being disposed in a cavity of a thin film deposition device, the gas showerhead comprising:
   a first-layer panel comprising a plurality of first gas supply holes distributed according to a first rule, the first-layer panel being immovable; and
   a second-layer panel seated on the first-layer panel and comprising a plurality of second gas supply holes distributed according to a second rule, wherein:
   the first rule is different from the second rule,
   the second-layer panel is capable of rotating relative to the first-layer panel between a first position and a second position that are different relative to each other,
   at the first position, none of the plurality of first gas supply holes are covered by the second-layer panel,
   at the second position, a portion of the plurality of first gas supply holes are aligned with the corresponding second gas supply holes and an other portion of the plurality of first gas supply holes are covered by the second-layer panel,
   the gas showerhead further comprising a first rotating device for rotating the second-layer panel, the first rotating device being adjacent to an edge of the second-layer panel,
   the first rotating device comprising:
      a rotating column that is configured to rotate; and
      a control column fixedly connected to or integrally formed with the rotating column,
   the second-layer panel further comprises a lug extending outward from the edge of the second-layer panel, the lug defining an elongated slot that matches the control column,
   the first-layer panel further comprises an annular peripheral wall extending upward from an edge of the first-layer panel,
   an inner side of the annular peripheral wall defining a first notch that faces inward,
   the rotating column, the control column, and the lug are each within the first notch, and
   a width of the first notch is greater than a width of the lug.

2. The gas showerhead according to claim 1, wherein when the rotating column is driven to rotate, the control column matching the elongated slot drives the second-layer panel to rotate.

3. The gas showerhead according to claim 1, wherein the second-layer panel is capable of rotating by 3°–5° relative to the first-layer panel.

4. The gas showerhead according to claim 1, wherein:
   the first rotating device is adjacent to an edge of the second-layer panel and comprises a gear, and
   the edge of the second-layer panel comprises a plurality of teeth meshing with the gear such that, when the gear is driven to rotate, the teeth drive the second-layer panel to rotate.

5. The gas showerhead according to claim 1, wherein:
   an upper surface of the first-layer panel comprises a plurality of wavy concave and convex portions, and
   the second-layer panel comprises a rolling wheel capable of rolling on the plurality of wavy concave and convex portions such that, when the second-layer panel rotates relative to the first-layer panel, the rolling wheel rolls on the plurality of wavy concave and convex portions.

6. The gas showerhead according to claim 5, wherein when the second-layer panel is located at the first position and the second position, the rolling wheel is located on two different wave troughs of the plurality of wavy concave and convex portions, and a lower surface of the second-layer panel is in close contact with the upper surface of the first-layer panel.

7. The gas showerhead according to claim 1, further comprising a third-layer panel seated on the second-layer panel, the third-layer panel comprising a plurality of third gas supply holes distributed according to a third rule, the third rule being different from the first rule and the second rule.

8. The gas showerhead according to claim 7, wherein the third-layer panel is capable of being driven by a second rotating device to rotate.

9. The gas showerhead according to claim 8, wherein:
   the gas showerhead further comprises the second rotating device,
   the second rotating device is adjacent to an edge of the third-layer panel and comprises a rotating column capable of being driven to rotate and a control column fixedly connected to or integrally formed with the rotating column, and
   the third-layer panel comprises an elongated slot that matches the control column of the second rotating device such that, when the rotating column of the second rotating device is driven to rotate, the control column of the second rotating device matching the elongated slot of the third-layer panel drives the third-layer panel to rotate.

10. The gas showerhead according to claim 7, wherein the third-layer panel comprises a lug extending outward from the edge, and the lug of the third-layer panel defines the elongated slot of the third-layer panel.

11. The gas showerhead according to claim 10, wherein;
   the inner side of the annular peripheral wall defines a second notch that faces inward, and
   the rotating column of the second rotating device, the control column of the second rotating device, and the lug of the third-layer panel are all located within the second notch.

12. The gas showerhead according to claim 11, wherein the width of the second notch is greater than the width of the lug of the third-layer panel such that the third-layer panel is capable of rotating by 3°-5° relative to the first-layer panel.

13. The gas showerhead according to claim 8, wherein:
   the second rotating device is adjacent to an edge of the third-layer panel and comprises a gear, and
   the edge of the third-layer panel comprises a plurality of teeth meshing with the gear such that, when the gear is driven to rotate, the teeth drive the third-layer panel to rotate.

14. The gas showerhead according to claim 7, wherein:
   a lower surface of the third-layer panel comprises a plurality of wavy concave and convex portions, and
   the second-layer panel comprises a rolling wheel capable of rolling on the plurality of wavy concave and convex portions such that, when the third-layer panel rotates relative to the second-layer panel, the rolling wheel rolls on the plurality of wavy concave and convex portions.

15. The gas showerhead according to claim 14, wherein the plurality of wavy concave and convex portions have at least two different wave troughs, and when the rolling wheel is located in the wave troughs of the plurality of wavy concave and convex portions, the lower surface of the third-layer panel is in close contact with an upper surface of the second-layer panel.

16. The gas showerhead according to claim 7, wherein the first-layer panel, the second-layer panel, and the third-layer panel are all substantially disc-shaped, and are disposed concentrically.

17. The gas showerhead according to claim 16, wherein:
the annular peripheral wall defines a concave cavity is formed in the middle of the first-layer panel, and
the second-layer panel and the third-layer panel are within the concave cavity.

18. The gas showerhead according to claim 17, wherein a plurality of rolling columns are disposed on an inner side of the annular peripheral wall, the plurality of rolling columns protruding from an inner surface of the annular peripheral wall and being in close contact with the edges of the second-layer panel and the third-layer panel to provide positioning therefor.

19. The gas showerhead according to claim 1, wherein the second-layer panel is capable of rotating by 3°-10° relative to the first-layer panel.

20. The gas showerhead according to claim 8, wherein the third-layer panel is capable of rotating by 3°-10° relative to the first-layer panel.

* * * * *